(12) United States Patent
Hodgson et al.

(10) Patent No.: US 8,541,947 B2
(45) Date of Patent: Sep. 24, 2013

(54) LIGHTING DEVICES

(75) Inventors: Thomas Scott Hodgson, Holland, MI (US); Kathleen M. Pacheco, Holland, MI (US); Steven M. Spoerre, Holland, MI (US); Randy L. Arendsen, Zeeland, MI (US); Art Vonderwell, Hilliard, MI (US); Bryan T. Jones, Holland, MI (US); Mark J. Bussis, Hudsonville, MI (US); Rodney J. Tindall, Zeeland, MI (US); Theron J. Hicks, Grand Rapids, MI (US); Chad Wernicke, Holland, MI (US); Bryan Thieme, Grand Rapids, MI (US)

(73) Assignee: Johnson Controls Technology Company, Holland, MI (US)

( * ) Notice: Subject to any disclaimer, the term of this patent is extended or adjusted under 35 U.S.C. 154(b) by 561 days.

(21) Appl. No.: 12/529,116

(22) PCT Filed: Mar. 21, 2008

(86) PCT No.: PCT/US2008/057954
§ 371 (c)(1),
(2), (4) Date: Aug. 3, 2010

(87) PCT Pub. No.: WO2008/116208
PCT Pub. Date: Sep. 25, 2008

(65) Prior Publication Data
US 2011/0006684 A1 Jan. 13, 2011

Related U.S. Application Data

(60) Provisional application No. 60/919,485, filed on Mar. 22, 2007, provisional application No. 60/924,046, filed on Apr. 27, 2007, provisional application No. 60/929,459, filed on Jun. 28, 2007.

(51) Int. Cl.
*B60Q 1/14* (2006.01)
*H05B 37/02* (2006.01)
*F21S 8/10* (2006.01)

(52) U.S. Cl.
USPC .............. 315/77; 315/291; 315/362; 362/549

(58) Field of Classification Search
None
See application file for complete search history.

(56) References Cited

U.S. PATENT DOCUMENTS

2006/0050524 A1 3/2006 Tiesler et al.
2006/0274540 A1* 12/2006 Klaver et al. ................. 362/479

FOREIGN PATENT DOCUMENTS

DE 195 27 595 A1 2/1996
JP 2008-37244 2/2008

OTHER PUBLICATIONS

PCT International Search Report corresponding to PCT/US2008/057954, dated Oct. 20, 2008, 5 pages.
PCT Written Opinion corresponding to PCT/US2008/057954, dated Oct. 20, 2008, 12 pages.

* cited by examiner

*Primary Examiner* — Crystal L Hammond
(74) *Attorney, Agent, or Firm* — Foley & Lardner LLP

(57) ABSTRACT

Lighting devices for a vehicle are disclosed that can include a light emitting diode and control circuitry for the light emitting diode. Also disclosed are circuits for a light emitting diode. Additionally, a method of forming a lighting device is disclosed. The lighting device, circuits, and method can be used, for example, to illuminate the interior of a vehicle.

20 Claims, 30 Drawing Sheets

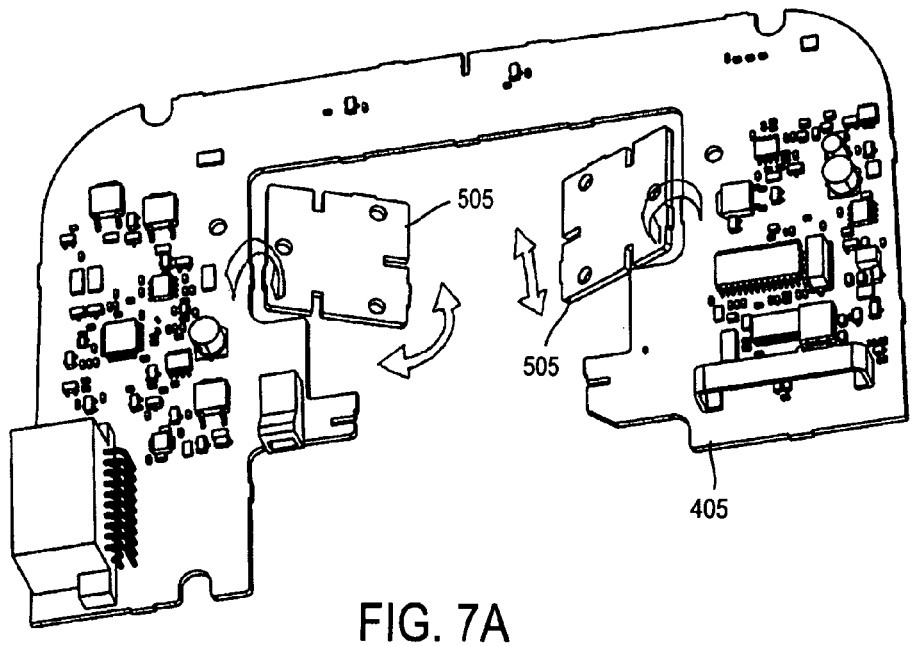
FIG. 7A
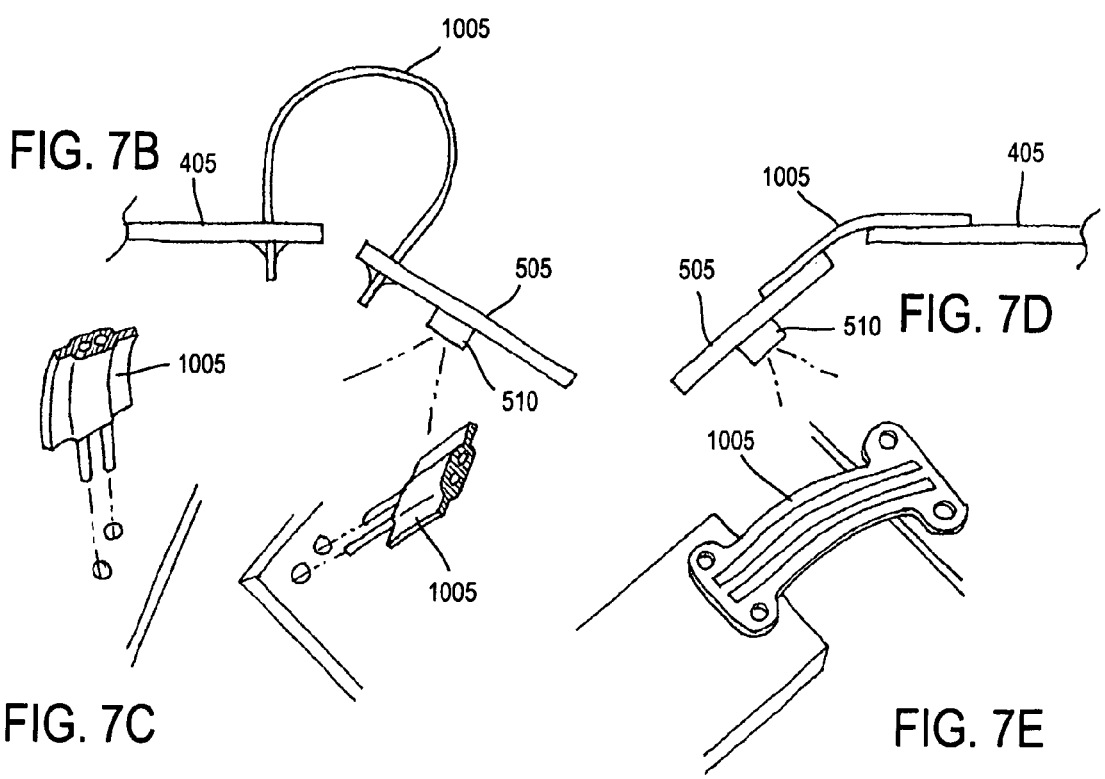
FIG. 7B
FIG. 7C
FIG. 7D
FIG. 7E

LIGHTING DEVICES

CROSS REFERENCE TO RELATED PATENT APPLICATIONS

The present application is a National Stage of PCT/US2008/057954, filed Mar. 21, 2008 which claims priority to and the benefit of U.S. Provisional Application No. 60/924,046 entitled "LED Vehicle Lighting" filed Apr. 27, 2007, U.S. Provisional Application No. 60/919,485 entitled "Light Assembly for Vehicle" filed Mar. 22, 2007, and U.S. Provisional Application No. 60/929,459 entitled "LED Vehicle Lighting" filed Jun. 28, 2007. The foregoing applications are incorporated by reference herein in their entirety.

BACKGROUND

The following background is provided simply as an aid in understanding the disclosed device, circuits, and method and is not admitted to describe or constitute prior art.

The present disclosure is relates to lighting devices for vehicles, circuits for light emitting diodes, and a method of forming a lighting device. The lighting devices, circuits, and method can be used, for example, for various vehicles such as, but not limited to automobiles, trains, aircraft, boats, etc. As specific examples, they can be used in the interior of a vehicle in locations such as an overhead console or a rear lamp assembly.

SUMMARY

According to an exemplary embodiment, a lighting device for a vehicle includes control circuitry connected to a first substrate, and a light emitting diode connected to a second substrate. The control circuitry is configured to drive the light emitting diode.

According to an exemplary embodiment, a lighting device for a vehicle includes control circuitry connected to a first portion of a first substrate, a light emitting diode connected to one of a second portion of the first substrate and a second substrate, and a flexible conductive interconnect that electrically connects the control circuitry to the light emitting diode. The one of the second portion of the first substrate and the second substrate is configured to be moveable relative to the first portion of the first substrate. The control circuitry is configured to drive the light emitting diode.

According to an exemplary embodiment, a lighting device for a vehicle includes a light emitting diode, control circuitry configured to drive the light emitting diode and connected to a first substrate, a flexible conductive interconnect that electrically connects the control circuitry to the light emitting diode, and a mechanical connector configured to provide an electrical connection between the flexible conductive interconnect and the light emitting diode.

According to an exemplary embodiment, a lighting device for a vehicle includes a housing, a light emitting diode connected to the housing, and circuitry configured to power the light emitting diode and at least one of printed on, stamped on, deposited on, adhered to, and molded to the housing.

According to an exemplary embodiment, a lighting device for a vehicle includes a light emitting diode, control circuitry for driving the light emitting diode, and a light guide configured to direct light emitted from the light emitting diode to a first location to provide ambient light in at least a portion of an interior of the vehicle and to direct light emitted from the light emitting diode to a second location, smaller than the first location, within the interior of the vehicle.

According to an exemplary embodiment, a lighting device for a vehicle includes an electronic component configured to be mounted on a substantially transparent substrate on the vehicle, and at least one thin conductive strip configured to be mounted on the substantially transparent substrate to power the electronic component.

According to an exemplary embodiment, a lighting device for a vehicle includes a light emitting diode, control circuitry for driving the light emitting diode, and a mechanism for sensing temperature for protecting the light emitting diode and the circuitry from an over-temperature condition.

According to an exemplary embodiment, a lighting device for a vehicle includes a light emitting diode, and control circuitry for driving the light emitting diode. The control circuitry includes a power source, a switch, connected to the power source and connected in series with an inductor and the light emitting diode, and a control circuit connected to the switch, the light emitting diode and a resistor, for ensuring constant current flows through the light emitting diode.

According to an exemplary embodiment, a circuit for driving a light emitting diode includes a power source, a switch, connected to the power source and connected in series with an inductor and the light emitting diode, and a control circuit connected to the switch, the light emitting diode and a resistor, for ensuring constant current flows through the light emitting diode.

According to an exemplary embodiment, a lighting device for a vehicle includes a light emitting diode, and control circuitry for driving the light emitting diode. The control circuitry includes a power source, a light emitting diode connected to the power source, a transistor connected in series to the light emitting diode, and an amplifier, having an output connected to a first resistor and the transistor in series, wherein the output is fed back to a negative terminal of the amplifier and connected to a second resistor, for sensing a current of the light emitting diode, connected to ground, and a reference voltage connected to a positive terminal of the amplifier.

According to an exemplary embodiment, a linear amplifier power supply for driving light emitting diodes includes a power source, a light emitting diode connected to the power source, a transistor connected in series to the light emitting diode, and an amplifier, having an output connected to a first resistor and the transistor in series, wherein the output is fed back to a negative terminal of the amplifier and connected to a second resistor, for sensing a current of the light emitting diode, connected to ground, and a reference voltage connected to a positive terminal of the amplifier.

According to an exemplary embodiment, a lighting device for a vehicle includes a light emitting diode, and control circuitry for driving the light emitting diode. The control circuitry includes a power source, one or more light emitting diodes connected in series with the power source, wherein each light emitting diode has a switch connected in parallel with the light emitting diode, and a light emitting diode driver connected in series with the light emitting diodes and the power source for driving the light emitting diodes.

According to an exemplary embodiment, a single drive circuit for driving light emitting diodes includes a power source, one or more light emitting diodes connected in series with the power source, wherein each light emitting diode has a switch connected in parallel with the light emitting diode, and a light emitting diode driver connected in series with the light emitting diodes and the power source for driving the light emitting diodes.

According to an exemplary embodiment, a lighting device for a vehicle includes a light emitting diode, and control circuitry for driving the light emitting diode. The control circuitry includes an operational amplifier, an electronic component, providing a voltage value to a Zener diode, connected to a positive input of the operational amplifier, an adjustable linear voltage regulator receiving a power input and having an output connected to an anode of the light emitting diode, and a transistor, connected to an output of the operational amplifier, wherein the output is fed back to a negative terminal of the operational amplifier and wherein the transistor shunts a portion of the adjustable linear voltage regulator bias current.

According to an exemplary embodiment, a circuit for driving a light emitting diode includes an operational amplifier, an electronic component, providing a voltage value to a Zener diode, connected to a positive input of the operational amplifier, an adjustable linear voltage regulator receiving a power input and having an output connected to an anode of the light emitting diode, and a transistor, connected to an output of the operational amplifier, wherein the output is fed back to a negative terminal of the operational amplifier and wherein the transistor shunts a portion of the adjustable linear voltage regulator bias current.

According to an exemplary embodiment, a lighting device for a vehicle includes a light emitting diode, and control circuitry for driving the light emitting diode. The control circuitry includes a power source, a first transistor, connected to a first resistor connected in series to a positive terminal of the power source, the first transistor connected to a reference voltage connected to a negative terminal of the power source, a second transistor, connected to the first transistor at a node, the node having a second resistor connected in series to the positive terminal of the power source, the second transistor connected to a third resistor connected in series to the positive terminal of the power source, the second transistor connected to a fourth resistor connected in series to ground, and a third transistor, connected to the second transistor, connected to the light emitting diode, wherein the light emitting diode is connected to the positive terminal of the power source, and the third transistor connected to the fourth resistor connected in series to ground.

According to an exemplary embodiment, a circuit for driving a light emitting diode includes a power source, a first transistor, connected to a first resistor connected in series to a positive terminal of the power source, the first transistor connected to a reference voltage connected to a negative terminal of the power source, a second transistor, connected to the first transistor at a node, the node having a second resistor connected in series to the positive terminal of the power source, the second transistor connected to a third resistor connected in series to the positive terminal of the power source, the second transistor connected to a fourth resistor connected in series to ground, and a third transistor, connected to the second transistor, connected to the light emitting diode, wherein the light emitting diode is connected to the positive terminal of the power source, and the third transistor connected to the fourth resistor connected in series to ground.

According to an exemplary embodiment, a light emitting diode lamp includes one or more light emitting diodes connected to a substrate, wherein the light emitting diodes are independently controllable.

According to an exemplary embodiment, a circuit for varying the color and/or intensity of light emitted by two or more light emitting diodes includes a bi-directional current source, a first light emitting diode connected in series to a resistor and connected to the bi-directional current source, and a second light emitting diode connected in parallel with the first light emitting diode.

According to an exemplary embodiment, a lighting device for a vehicle includes a light emitting diode, and control circuitry for driving the light emitting diode. The control circuitry includes an electronic control module, having a switch, and a continuity signal and a wake-up signal as inputs to the electronic control module.

According to an exemplary embodiment, a circuit for driving a light emitting diode includes an electronic control module, having a switch, and a continuity signal and a wake-up signal as inputs to the electronic control module.

According to an exemplary embodiment, a lighting device for a vehicle includes a light emitting diode, and control circuitry for driving the light emitting diode. The control circuitry includes a power source, a first transistor, connected to a first resistor connected in series to a positive terminal of the power source, the first transistor connected to a reference voltage connected to a negative terminal of the power source, a second transistor, connected to the first transistor at a node, the node having a second resistor connected in series to the positive terminal of the power source, the second transistor connected to a third resistor connected in series to the positive terminal of the power source, the second transistor connected to a fourth resistor connected in series to ground, and a third transistor, connected to the second transistor, connected to the light emitting diode, wherein the light emitting diode is connected to the positive terminal of the power source, and the third transistor connected to the fourth resistor connected in series to ground.

According to an exemplary embodiment, a circuit for driving a light emitting diode includes a power source, a first transistor, connected to a first resistor connected in series to a positive terminal of the power source, the first transistor connected to a reference voltage connected to a negative terminal of the power source, a second transistor, connected to the first transistor at a node, the node having a second resistor connected in series to the positive terminal of the power source, the second transistor connected to a third resistor connected in series to the positive terminal of the power source, the second transistor connected to a fourth resistor connected in series to ground, and a third transistor, connected to the second transistor, connected to the light emitting diode, wherein the light emitting diode is connected to the positive terminal of the power source, and the third transistor connected to the fourth resistor connected in series to ground.

According to an exemplary embodiment, a lighting device for a vehicle includes a light emitting diode, and control circuitry for driving the light emitting diode. The control circuitry includes an operational amplifier, a voltage value connected to a positive input of the operational amplifier, an adjustable linear voltage regulator receiving a power input and having an output connected to an anode of the light emitting diode, and a transistor, connected to an output of the operational amplifier, wherein the output is fed back to a negative terminal of the operational amplifier and wherein the transistor shunts a portion of the adjustable linear voltage regulator bias current.

According to an exemplary embodiment, a circuit for driving a light emitting diode includes an operational amplifier, a voltage value connected to a positive input of the operational amplifier, an adjustable linear voltage regulator receiving a power input and having an output connected to an anode of the light emitting diode, and a transistor, connected to an output of the operational amplifier, wherein the output is fed back to a negative terminal of the operational amplifier and wherein the transistor shunts a portion of the adjustable linear voltage regulator bias current.

According to an exemplary embodiment, a lighting device for a vehicle includes a light emitting diode, and a processor configured to control the light emitting diode and at least one other electrical component of the vehicle.

According to an exemplary embodiment, a method of forming a lighting device for a vehicle includes obtaining data about a light emitting diode for the lighting device, manipulating the data with software to create control information for the light emitting diode, and loading the control information into a processor that will control the light emitting diode.

It is to be understood that both the foregoing general description and the following detailed description are exemplary and explanatory only. These and other features, aspects and advantages will become apparent from the following description and the accompanying exemplary embodiments shown in the drawings, which are briefly described below.

BRIEF DESCRIPTION OF THE DRAWINGS

FIG. 7A shows an embodiment of the circuit boards and flexible conductive interconnects of the lighting device shown in FIG. 4.

FIGS. 7B-7C and FIGS. 7D-7E show two exemplary embodiments of flexible connectors coupling circuit boards to a main circuit board.

DETAILED DESCRIPTION

Figure 1:
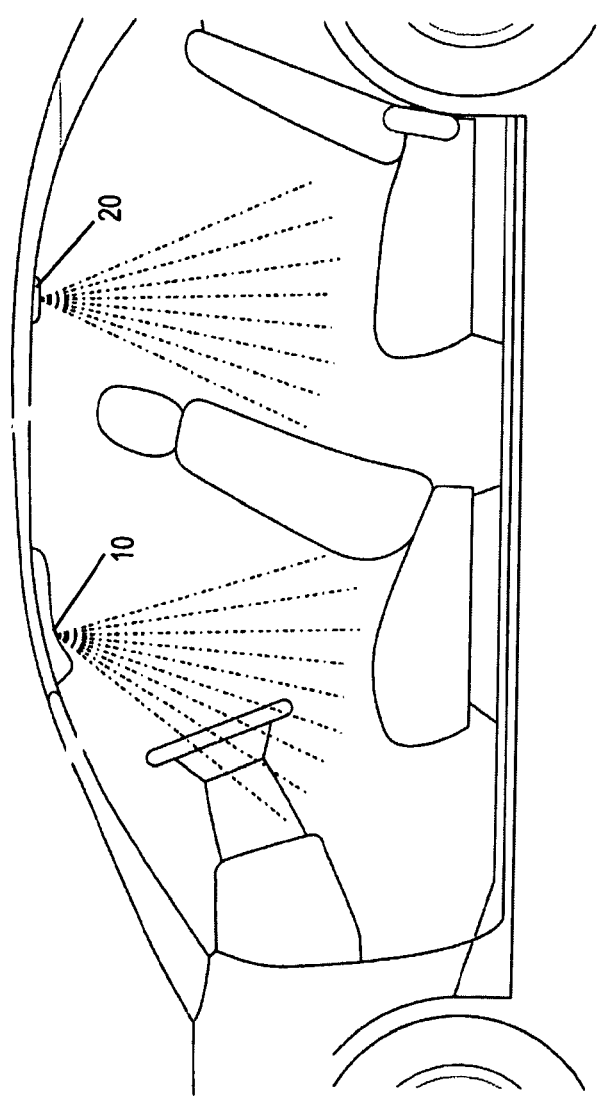
FIG. 1 is a schematic view of an embodiment of a vehicle with overhead lighting devices disposed in a front seat area and rear seat area.

It is to be understood that both the foregoing general description and the following detailed description are exemplary and explanatory only. Features, aspects and advantages of the lighting devices, circuits, and method will become apparent from the following description and the accompanying exemplary embodiments shown in the drawings, which are briefly described below. It should be understood that the following description is intended to describe exemplary embodiments, and not to limit the claimed invention.

Referring in general to the FIGURES, lighting devices and circuits are shown according to several exemplary embodiments. The lighting devices and circuits can be used, for example, in various vehicles such as, but not limited to automobiles, trains, aircraft, boats, etc. They also can be used, for example, in the interior of the vehicle, such as an overhead rear lamp or an overhead front console.

FIG. 1 is a schematic side view of an embodiment of a vehicle having a lighting device in an overhead console 10 and a lighting device in an overhead rear lamp 20. These placements of the overhead console 10 and the overhead rear lamp 20 are merely presented as examples. The overhead console 10 preferably is located in the interior of the vehicle and, more preferably, on the roof and centered above the front seating area. The overhead rear lamp 20 preferably is located further back in the interior of the vehicle and, more preferably, centered over the rear seating area.

Figure 2:
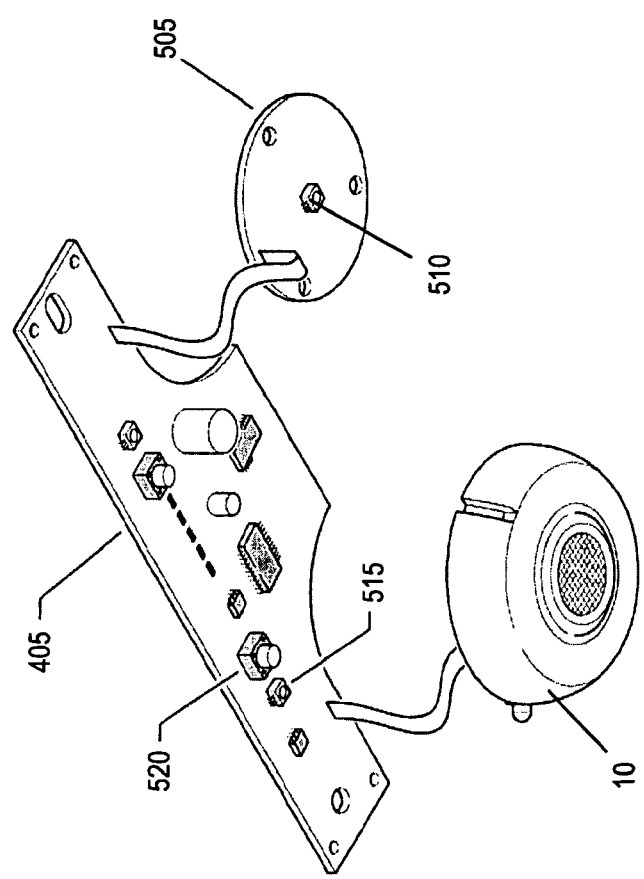
FIG. 2 shows an embodiment of a lighting device having control circuitry on a first substrate and a light emitting diode on a second substrate.

FIG. 2 is a conceptual, perspective view of an embodiment of a lighting device that could be incorporated, for example in the overhead console 10 or the overhead rear lamp 20. This embodiment can be configured, for example, to address issues related to thermal management and light beam direction. As shown in the embodiment of FIG. 2, the lighting device can include control circuitry on a first substrate 405 that is configured to drive a light source 510 (preferably electronic lighting and, more preferably an LED), on a second substrate 505. According to this exemplary embodiment, the first and second substrates preferably are printed circuit boards. By locating the control circuitry and LED on different substrates 405, 505, issues associated with heat generated by the control circuitry can be addressed. For example, heat generated by the control circuitry can impair the performance of an LED over time. By separating the control circuitry from the LED 510, this impact can be reduced. Moreover, by separating the LED 510 from the control circuitry, a more advantageous structure can be provided for aiming or directing the LED 510. For example, the LED 510 can be configured to be aimed or directed by manipulating, directly or indirectly, the second substrate 505.

Figure 3:
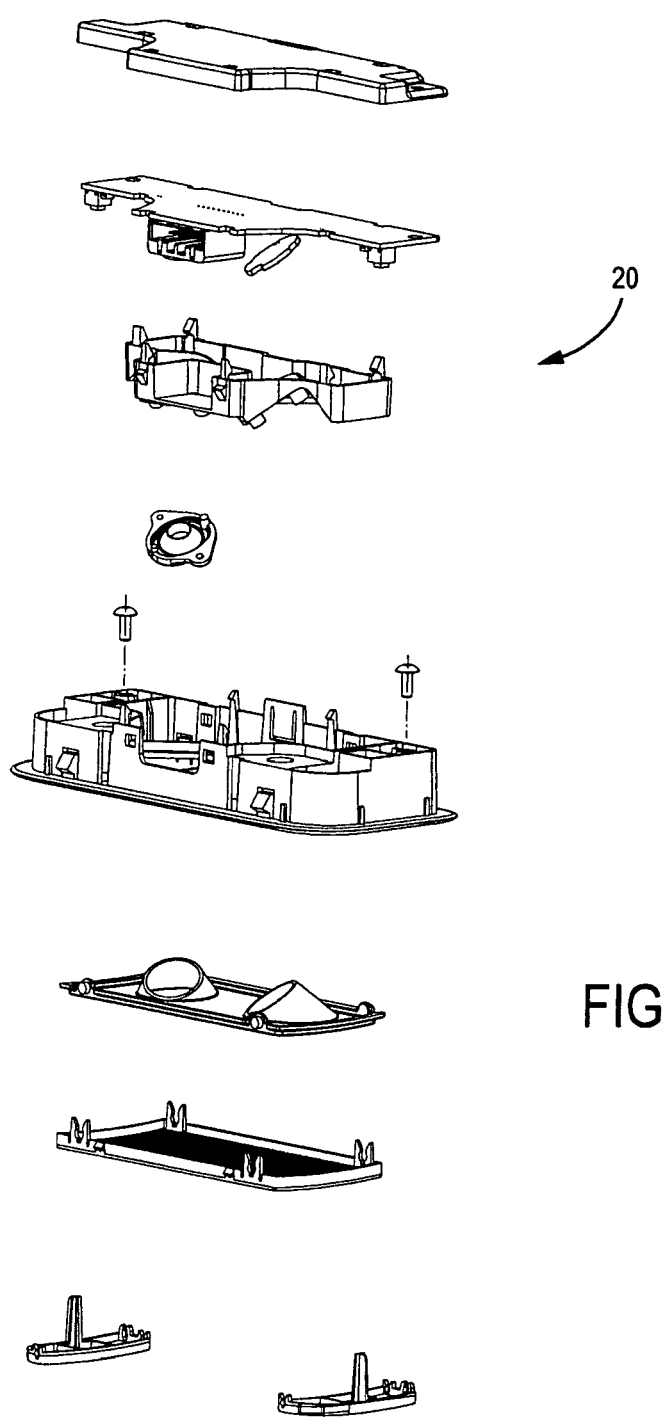
FIG. 3 shows an exploded view of an embodiment of lighting device configured, for example, to be disposed in a rear seat area of a vehicle.

FIG. 3 shows an exploded view of an embodiment of such an overhead rear lamp 20, which can be configured to incorporate one or more embodiments of the lighting devices described herein. The lamp can include light sources, one or more buttons to toggle the light sources on and off, an outer bezel, a lens veneer, a main body, one or more lenses, an inner bracket, a printed circuit board and other components to control the light sources, and a top panel. The light sources preferably are, for example, light-emitting diodes (LEDs), though other light sources, such as incandescent lights, could be used in some configurations. As a further example, two LEDs could be provided as task or courtesy lights, such as reading or map lights, and two LEDs could be provided for backlighting switches. One or more of the LEDs can be white light-emitting diodes that individually emit white light. In addition to any conventional construction, the printed circuit board can be, for example, any of the following: flex circuits, flat-flex cables, stamped circuits and molded circuit traces. The rear lamp 20 may be controlled based on signals received from a control circuit on the printed circuit board of the overhead console 10.

Figure 4:
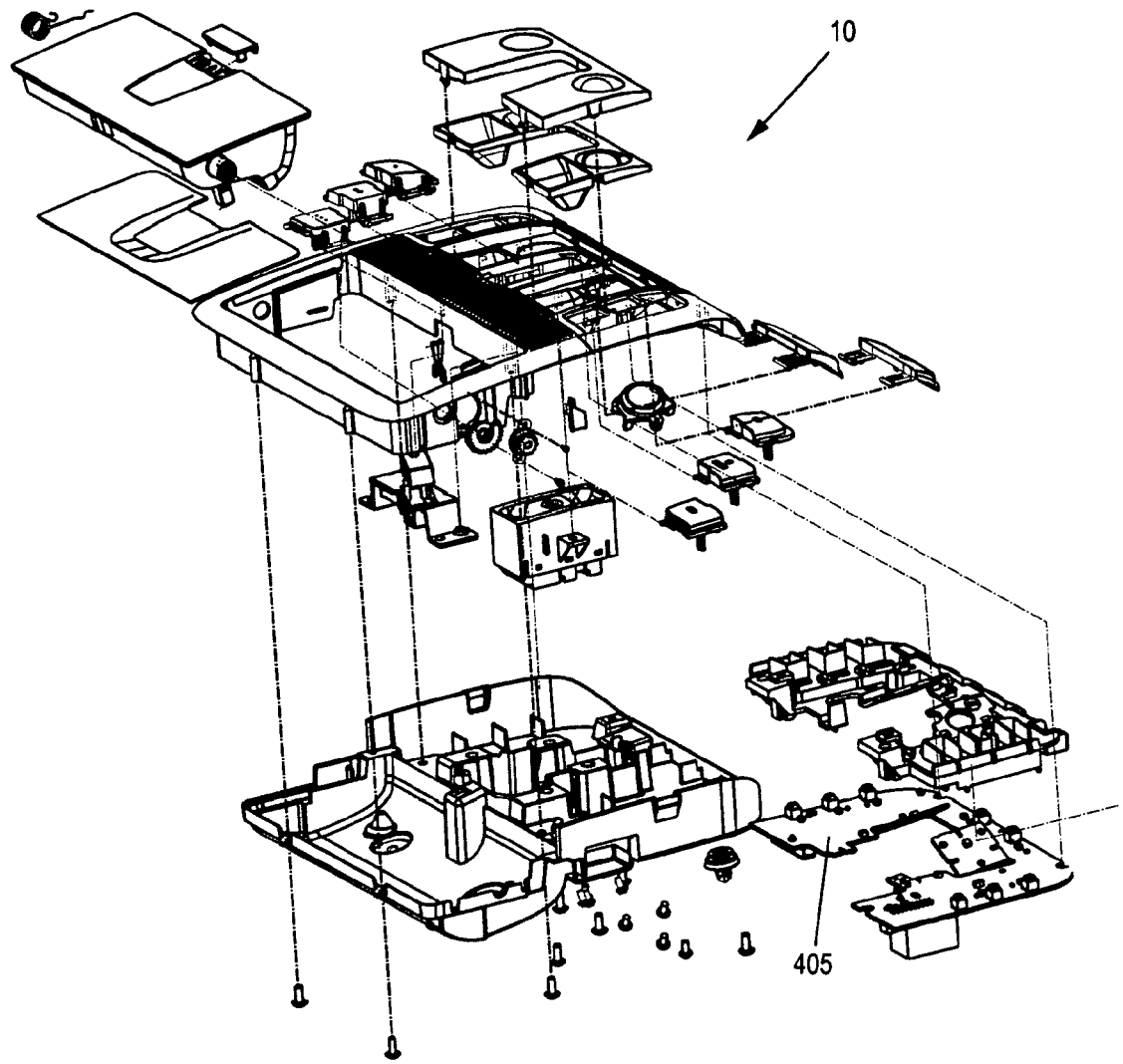
FIG. 4 shows an exploded view of an embodiment of lighting device configured, for example, to be disposed in a front seat area of a vehicle.
Figure 5:
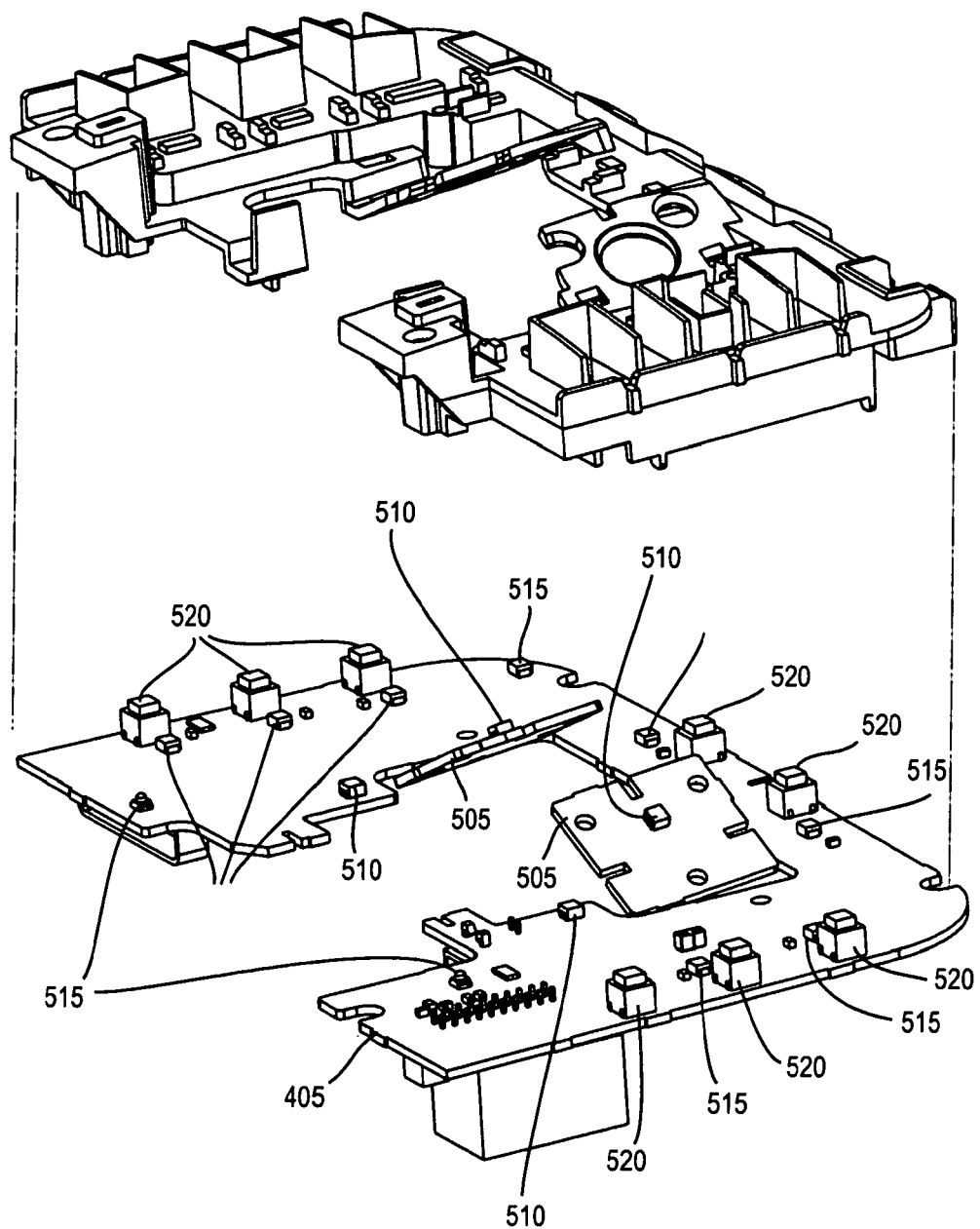
FIG. 5 shows a more detailed exploded view of an embodiment of the inner bracket and circuit boards of the lighting device shown in FIG. 4.

FIG. 4 shows an exploded view of an embodiment of the overhead console 10, which can be configured to incorporate one or more embodiments of the lighting devices described herein. In general, the console 10 preferably includes an inner bracket having control circuitry and light sources. FIG. 5 shows a more detailed exploded view of an inner bracket and circuit boards of the overhead console 10. The inner bracket preferably contains the first substrate 405, such as a main circuit board, and a pair of second substrates 505, such as angled circuit boards.

The main circuit board 405 can provide a surface or member to which the control circuitry, e.g., circuit components, are coupled. According to one exemplary embodiment (as shown in FIGS. 4 and 5), the main circuit board 405 may be generally U-shaped. The main circuit board 405 also may include LEDs 515 that provide backlighting to illuminate buttons. According to one exemplary embodiment, the main circuit board 405 includes LEDs 515 aligned with each of the button sockets. Each button can include a stylized opening with a clear portion or lens that is illuminated by the LED 515. The main circuit board 405 also may include switches 520 that are aligned with the buttons and are activated by the buttons when they are pressed by a user. The main circuit board 405 further may include LED overhead dome lights 515 that are aligned with lenses in the bezel. Accent lighting may be provided by another light source such as ambient light LEDs 515 and a light guide or guide on the main circuit board 405. The ambient lights 515 may be on all the time, or they may be tied to a switch 520 (e.g. a user actuated switch, a non-user actuated switch (e.g., a light level sensor), etc.). In some embodiments, the ambient lights 515 are configured to be ON when the headlights are ON and/or when the instrument panel backlighting is ON. The LEDs 515 may be white, blue, red, green, or any other suitable color.

The pair of angled circuit boards 505 can provide a surface or member to which the light sources, such as one or a plurality of LEDs 510, are coupled. The LEDs 510 can be task lights, such as map/reading lights. The angled circuit boards 505 may be coupled to the main circuit board 405 by a conventional mechanism (not shown) configured to permit movement of the angled circuit boards 505 relative to the main circuit board 405. The movement of the angled circuit boards 505 permits the LEDs 510 to be aimed or directed.

The LEDs for the task lights, the dome lights, the backlights, and the ambient lights can be, for example, white light-emitting diodes or can be non-white LEDs, such as blue or red or green LEDs.

According to the exemplary embodiment shown in FIG. 5, the circuit boards 405/505 includes sixteen LEDs 510/515, and the LEDs 510/515 can provide backlight, reading or map light, ambient light, or dome light. The LEDs could, for example be aligned with lenses. According to various exemplary embodiments, the lens may be formed from a generally clear material or a colored translucent or transparent material. The lens may be a simple geometric shape or a more complex shape such as an illustration of a light bulb or a word.

Additionally, the console 10 can include, for example, a multitude of buttons that are configured for a variety of tasks including controlling overhead task lights (e.g., map or reading lights, etc.), controlling other interior lights, controlling sunroofs, and/or controlling short range radio communication equipment (e.g., Bluetooth®, Homelink® wireless control systems (WCS), etc.). The overhead console also can include a back cover, an outer bezel with multitude of button sockets, buttons that are received in the button sockets, an inner bracket that traps the buttons within the button sockets, As shown in FIG. 5, the inner bracket fits within the bezel and may be coupled to the bezel with screws, a snap fit, or other suitable fastening methods. The inner bracket preferably includes openings aligned with the button sockets. The inner bracket traps pivot arms for the buttons between the inner bracket and the bezel. The inner bracket also includes walls aligned with the buttons that extend downward to provide a light block and a physical stop for the button. The inner bracket can also include a light guide for the ambient light LEDs 515.

Figure 6:
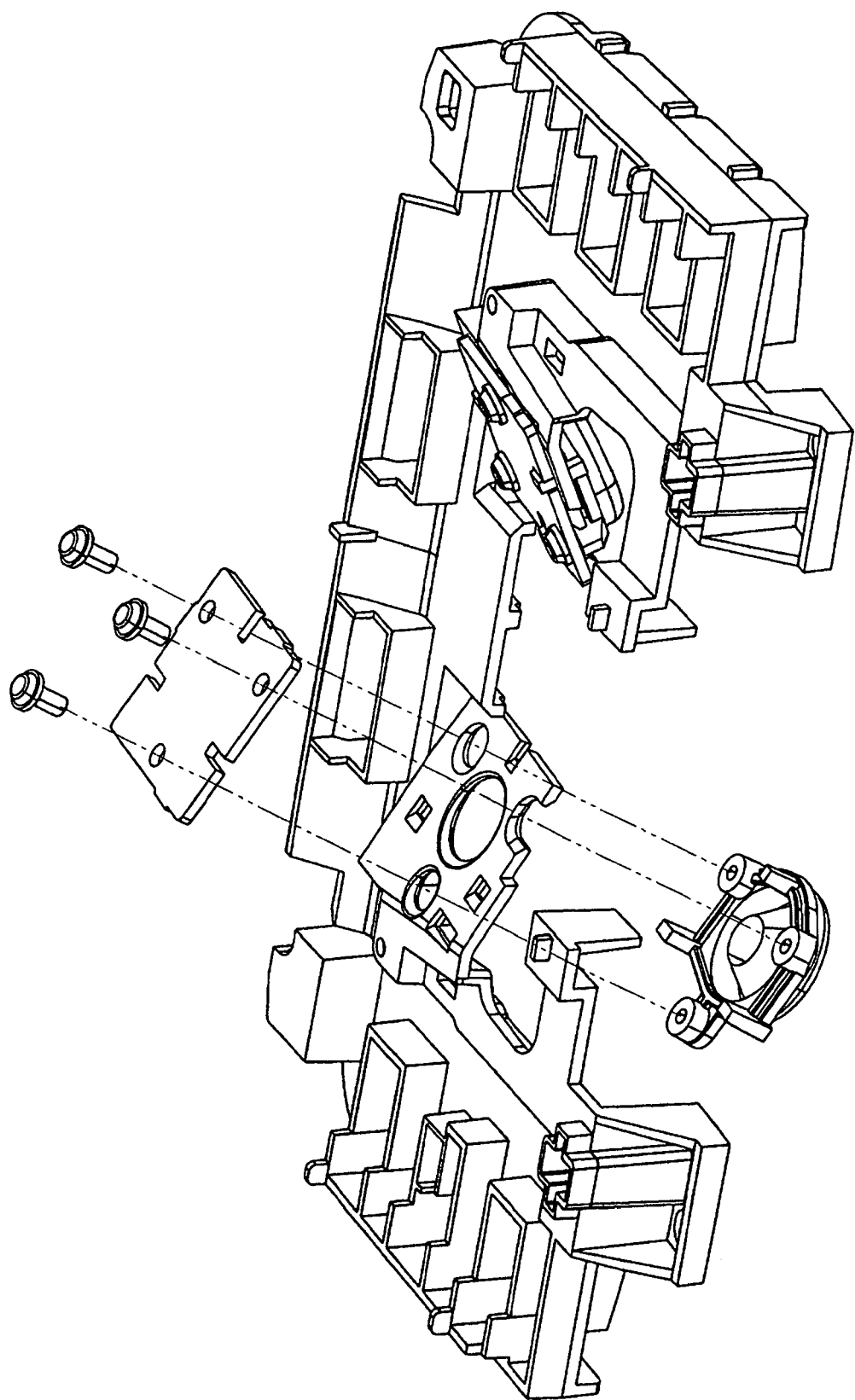
FIG. 6 shows a more detailed exploded view of an embodiment of the inner bracket, circuit boards, and connecting structure of the lighting device shown in FIG. 4.

FIG. 6 is a partial exploded view of an embodiment of a portion (e.g., a map light assembly) of the overhead console 10. The left side of FIG. 6 shows an exploded view of the map light components, and the right side of FIG. 6 shows an assembled view of the map light components. As shown in the left side of FIG. 6, the inner bracket includes an angled map light bracket that serves as a mounting surface for the angled circuit board 505 (e.g., a map light circuit board). The map light bracket is angled to orient the angled circuit boards 505 so that the map light LED illuminates a desired location in the interior of the vehicle. The angled circuit boards 505 is coupled to the top of the angled map light bracket, and the angled map light bracket includes a central opening to receive the LED 510. A map light lens can be coupled to the bottom of the angled map light bracket to focus a portion of the light produced by the LED 510. The angled circuit boards 505 can be assembled to the angled map light bracket, for example, by screws, such as the three screws shown in FIG. 6, or by any other suitable mounting mechanisms. According to this exemplary embodiment, the angled map light bracket can be replaced with a bracket of a different angle (at a different orientation relative to the inner bracket) to illuminate a different location in the vehicle, depending on the lighting application. Thus, the light assembly of FIG. 6 provides a construction that can be used in multiple vehicle lighting applications.

According to an exemplary embodiment, each of the angled circuit boards 505 (and the LEDs 510 thereon) can be electrically connected to the main circuit board 405 (and the control circuitry thereon) by a flexible conductive interconnect. Power from control circuitry to power the angled circuit boards, which can be present on the main circuit board 405, can be transmitted to the angled circuit boards 505 through the flexible conductive interconnects. Embodiments of flexible conductive interconnects will be described in connection with FIGS. 7A-7E.

FIG. 7A shows the angled circuit boards 505 of the overhead console 10 connected to the main circuit board 405. FIGS. 7B-7C and FIGS. 7D-7E show two exemplary flexible conductive interconnects 1005 to couple the map light LED circuit boards 505 to the main circuit board 405. In both FIGS. 7B-7C and FIGS. 7D-7E, the circuit boards are connected with a flexible conductive interconnect 1005 that includes flex circuitry. According to one exemplary embodiment shown in FIGS. 7B-7C, the flexible conductive interconnect 1005 has ends that are generally perpendicular to the surface of the circuit boards 405, 505. The ends pass through openings in the circuit boards 405, 505 and can be soldered to the opposite side of the circuit boards 405, 505. According to another exemplary embodiment shown in FIGS. 7D-7E, the flexible conductive interconnect 1005 has ends that are generally parallel with the surface of the circuit boards 405, 505. The ends lay against the circuit boards 405, 505 and can be soldered to the circuit boards 405, 505. According to other exemplary embodiments, the ends of the flexible conductive interconnect 1005 may be received by sockets or connectors coupled to the main circuit board 405 and to angled circuit boards 505. Providing separate circuit boards for the map light LEDs that are moveable relative to the main circuit board allows the circuit board assembly to be used in a variety of vehicles. Because different vehicles may have varied targets for the map lights, a map light circuit board that is moveable relative to the main circuit board allows the orientation of the map light to be adjusted to fit the needs of the vehicle.

The overhead console 10 may come in many different variations depending on which systems are included in the module. For example, one embodiment includes only the lighting devices (e.g. map light, overhead light, ambient light, etc.). Another embodiment includes the lighting devices, a hands-free telephone (HFT) microphone, and a wireless control system (WCS). Another embodiment includes the lighting device and a microphone. Another embodiment includes a navigation microphone and a WCS. Each of these embodiments may include a sun shade control switch. Another embodiment includes the lighting device and a WCS. When a WCS is not included, a panel can be used in place of the WCS buttons.

Figure 8:
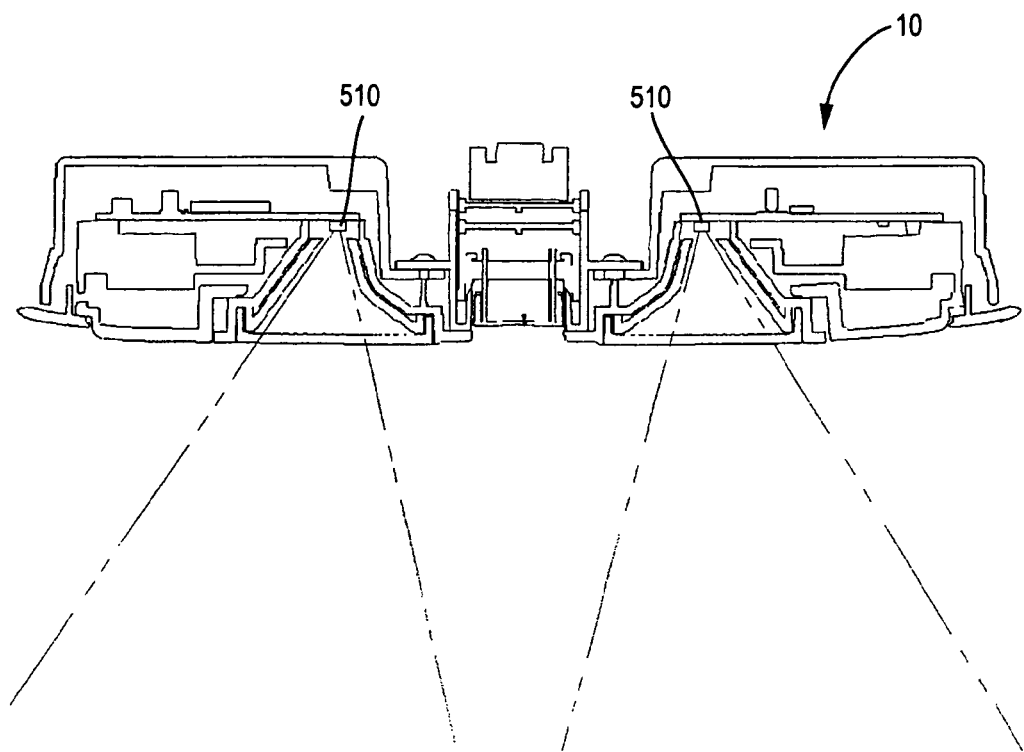
FIGS. 8 and 9 are cross-sectional views taken through dome lights of the lighting device shown in FIG. 4.
Figure 9:
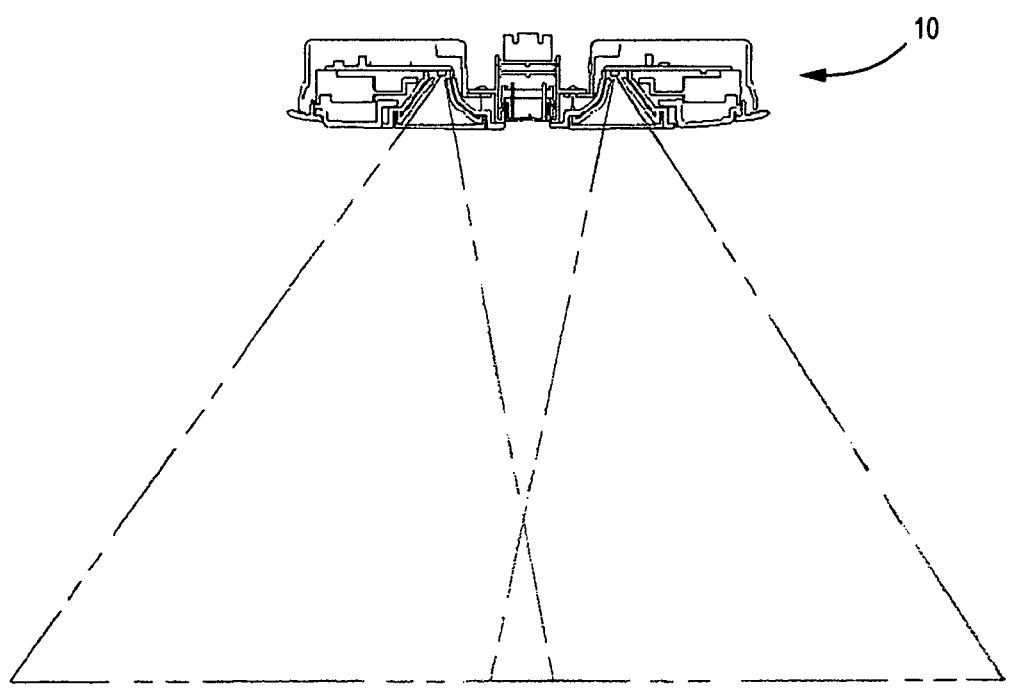

FIGS. 8 and 9 are cross-sections of embodiments of overhead console 10 taken through the dome lights. The console of FIGS. 8 and 9 can illuminate a very large area. In FIG. 8, the area illuminated by the lights can be configured such that they do not overlap. In FIG. 9, the area illuminated by the lights is configured to overlap. In other words, the area illuminated by the left dome light and the area illuminated by the right dome light overlap and both dome lights illuminate an area in the middle. An overlapping light coverage allows the dome lights to provide greater illumination for a portion of the vehicle. The light can be emitted, for example, by LEDs 510.

The outer lens of the overhead console 10 may include an additional focusing feature. The focusing feature can include concave optics, convex optics, pyramid optics, pillow optics, textured surfaces, and additives such as pigments, glass beads, etc. The outer lens provides a solution to the following problems. The focused light from the LED 510 may include color separation and an illuminated area that is too small. The focusing feature on the inner lens creates a more focused beam for a reading/map lamp while the rest of the outer lens or pillow lens provides a more diffused light that surrounds the focused portion. The inner and outer lenses allow a single LED 510 to act as both a map lamp and a courtesy lamp.

Figure 10:
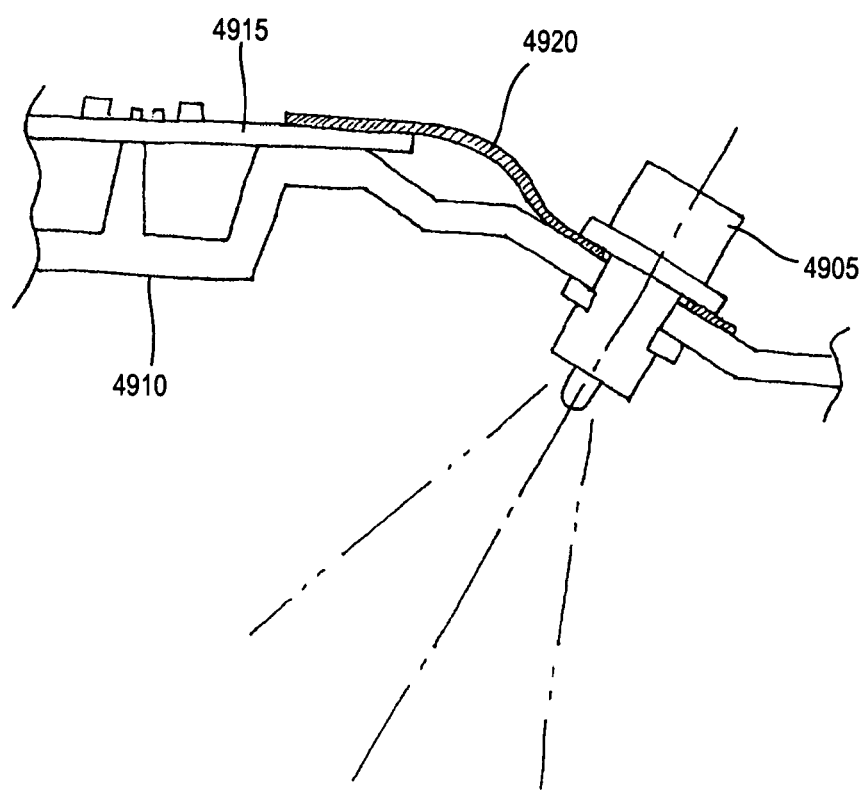
FIG. 10, shows another embodiment of a lighting device having a mechanical connector that provides an electrical connection between a flexible conductive interconnect and a light emitting diode.

FIG. 10 is a partial cross section of an overhead console module similar to the one shown in FIG. 5. However, the console in FIG. 10 eliminates the need for separate satellite circuit boards and light guides for the LED map lights. Instead, the LEDs 4905 are provided as part of a module that is coupled to the housing 4910 (e.g., with a ¼-turn connection). The LED module 4905 may be coupled to the main circuit board 4915 with a flexible conductive interconnect 4920 similar to the ones shown in FIGS. 7B-7C and FIGS. 7D-7E. The flexible conductive interconnect 4920, which can be a flexible wire, makes it possible to move the LED 4905 to different locations or orientations relative to the main circuit board. The control circuitry may be mounted on the same substrate as the LED 4905, with the flexible conductive interconnect forming an integral portion of the substrate. Alternatively, the control circuitry may be mounted on a main circuit board, the LED 4905 may be mounted on an angled circuit board, and the flexible conductive interconnect may be disposed therebetween.

Figure 11:
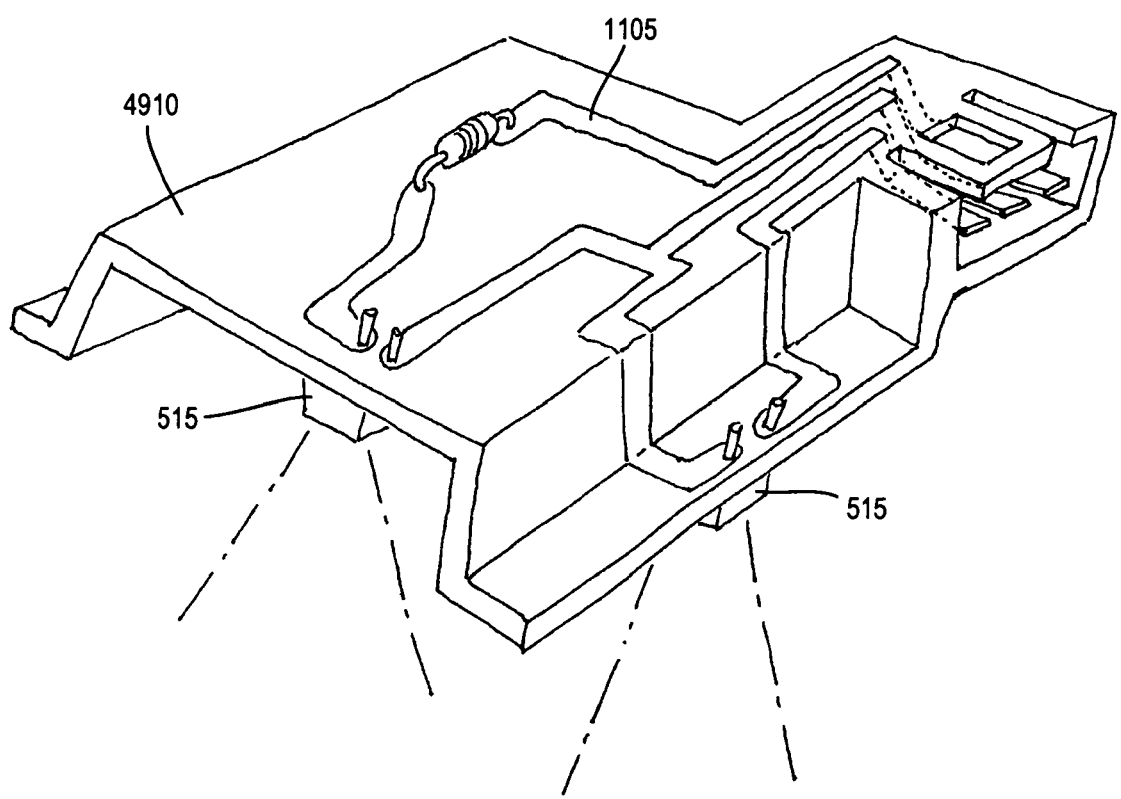
FIG. 11 is a perspective view of an embodiment of a lighting device having a housing with a control circuit provided thereon.
Figure 12A:
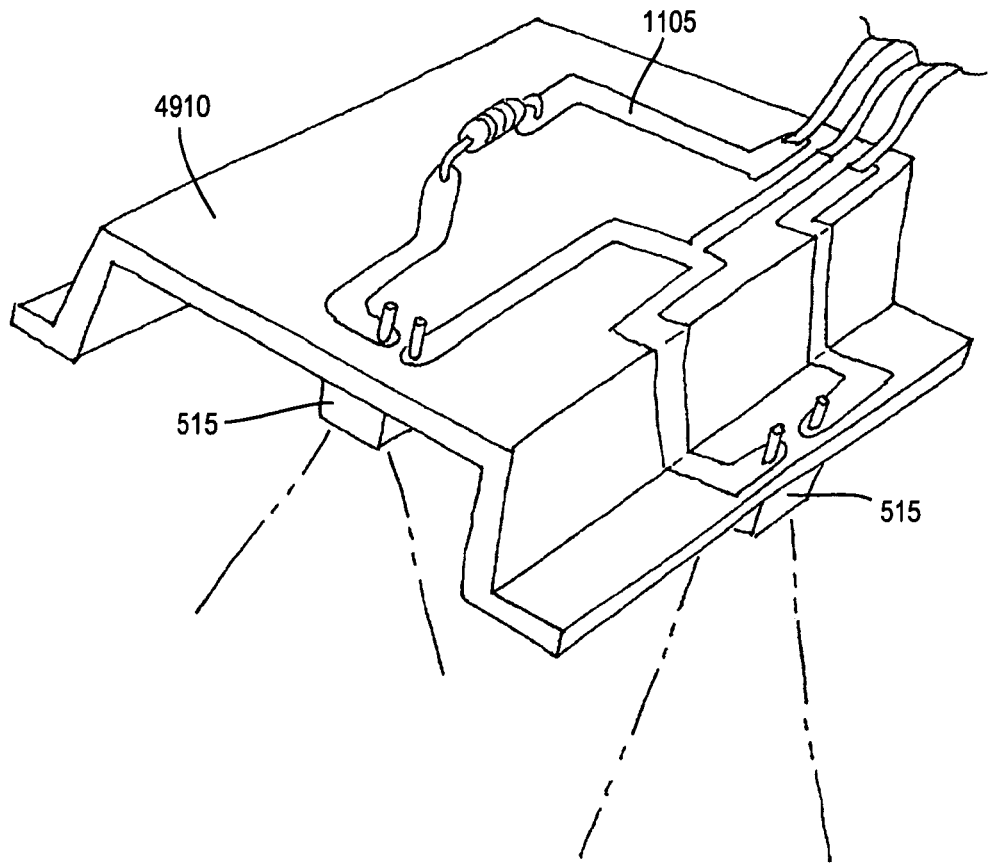
FIGS. 12A and 12B are a perspective view and a cross-sectional view of another embodiment of a lighting device having a housing with a control circuit provided thereon.
Figure 12B:
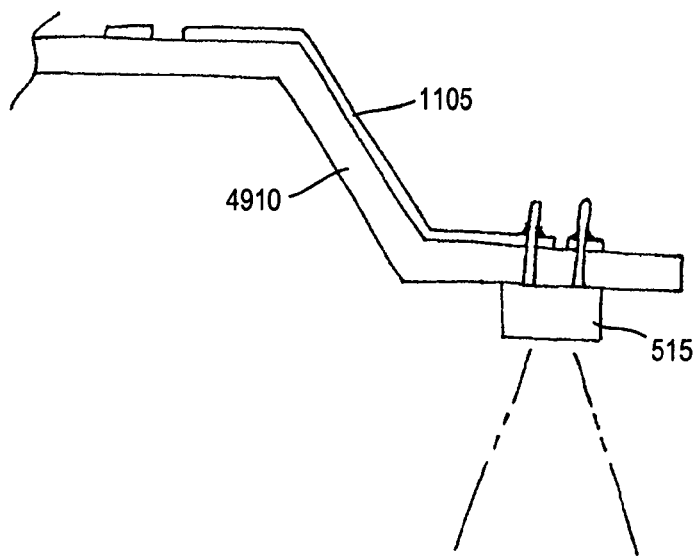

FIG. 11 is a schematic of lighting device for a vehicle having a housing, an LED mounted on the housing and a circuit. The circuit can be a stamped, printed or molded circuit. A circuit formed in this manner eliminates the need for a PCB. The circuit of FIG. 11 addresses cost and thermal management issues. FIG. 11 shows a circuit to which LEDs and a resistor are directly clinched. Alternatively, the LEDs and resistor could be soldered or otherwise attached to the stamped circuit. The circuit also incorporates a vehicle connection header. FIG. 12A is an isometric view and FIG. 12B is a partial cross-section of a housing that includes a printed conductor. The printed conductor is a conductive ink or other suitable material that is applied to the housing (e.g., with a screen printing process, plating process, etc.) or other structural member to provide power to an LED without the need of a separate printed circuit board.

Figure 13:
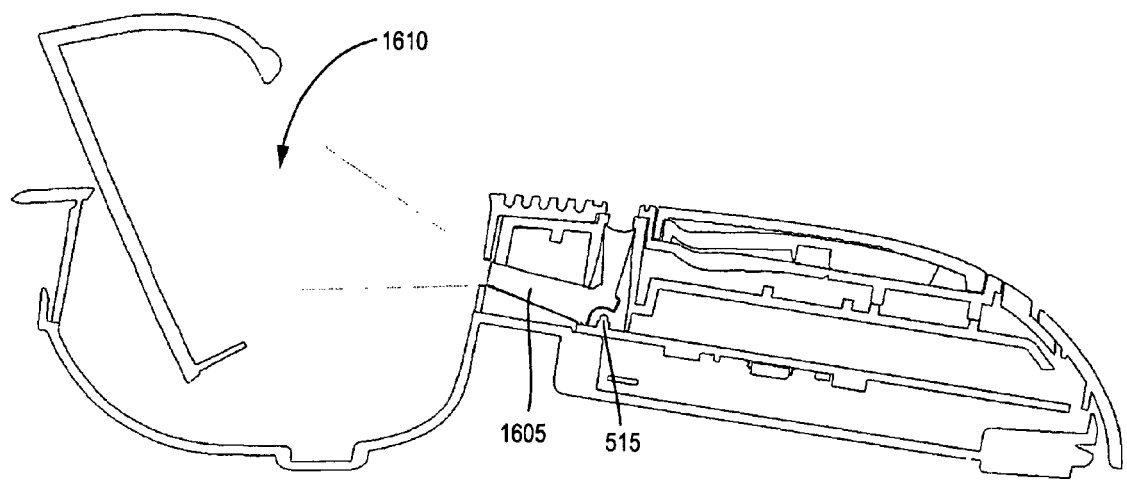
FIG. 13 is a cross-sectional view of the lighting device shown in FIG. 4, illustrating an embodiment having a light guide that directs light to a first location of the vehicle for ambient light and to a smaller second location, e.g., a storage area.

FIG. 13 is a cross section of the overhead console in FIG. 8 showing a light guide 1605 that directs light to the storage area 1610. According to other exemplary embodiments, light may be directed from any light source provided in the overhead console (e.g., courtesy lamps, task lamps, ambient lighting, etc.) and may be directed to the storage area 1610 with another suitable method (e.g., a reflective surface, fiber optic lines, etc.). This configuration reduces the number of lights required to provide ambient lighting.

Figure 14A:
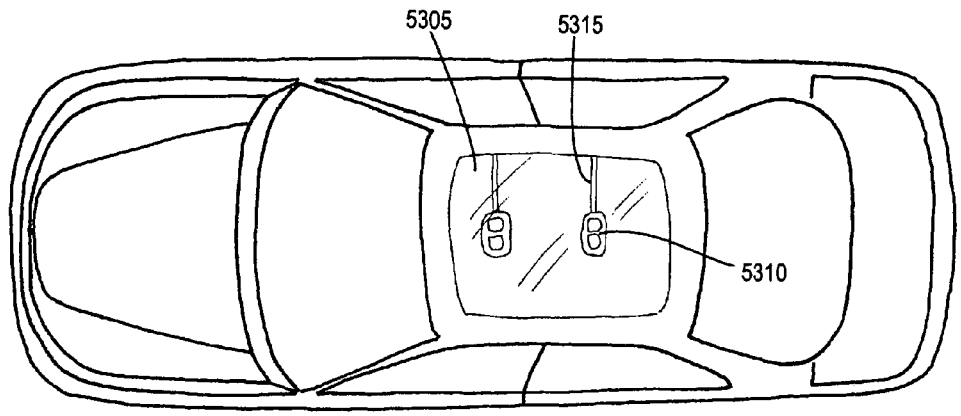
FIGS. 14A-14C show an embodiment having lighting devices mounted on a substantially transparent roof panel and having thin conductive strips for powering the lighting devices.
Figure 14B:
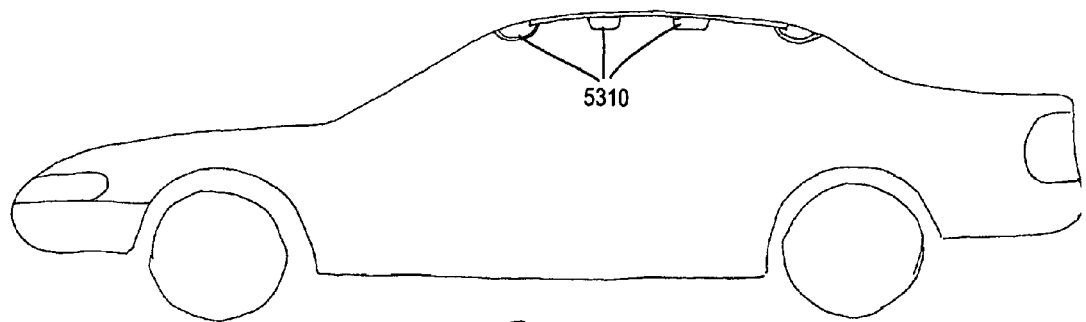
Figure 14C:
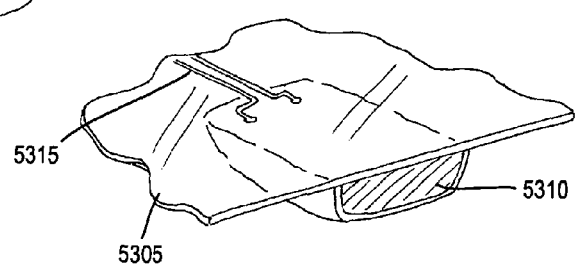

FIG. 14A and FIG. 14B are top and side views, respectively, of a vehicle with a transparent roof panel 5305 and one or more LED overhead lamps 5310 coupled to the transparent roof panel 5305. FIG. 14C is a partial cross section of the transparent roof panel 5305 and LED overhead lamp 5310 according to one exemplary embodiment. Conductive leads 5315 are coupled to the roof panel 5305 and provide power to the LED overhead lamp 5310. These LED overhead lamps 5310 can provide ambient light and task-related light to the interior of the vehicle. The transparent roof panel 5305 can be glass or any other suitable transparent material.

Figure 15:
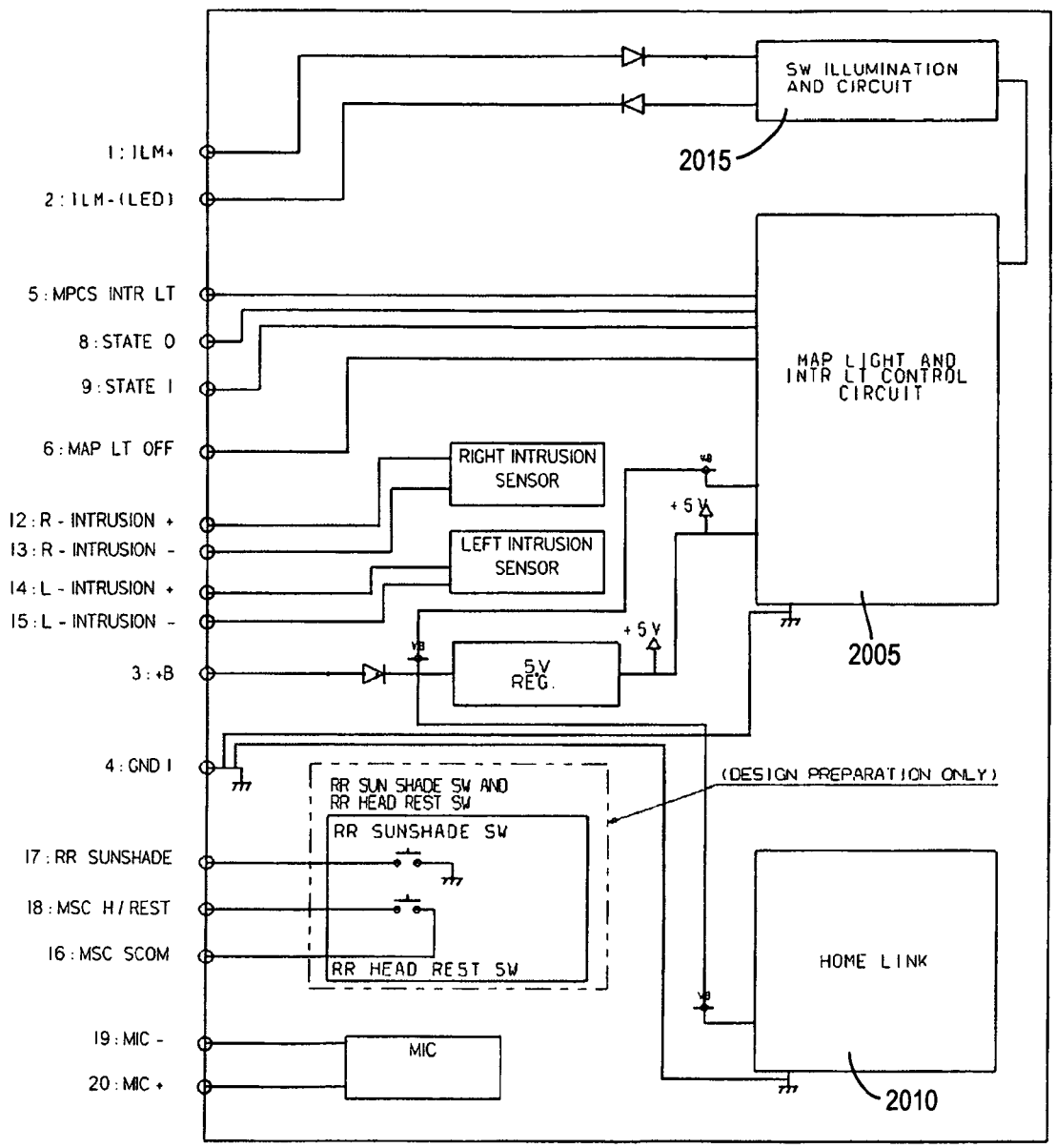
FIGS. 15-18 show exemplary embodiments of circuits for lighting devices.

FIGS. 15-18 show exemplary embodiments of the electronics associated with the lighting device of FIGS. 1-5. FIG. 15 is a block diagram of the electronics for the lighting device. The overhead console includes control circuits 2005, 2015 for the switch illumination lights, overhead lights, other interior lights, and a short-range radio communication device 2010 (e.g., a garage door opener, HomeLink® WCS). The control circuitry 2005, 2015 can use LED data (temperature data, intensity degradation, other manufacturing data, etc.) to control LEDs in the lighting device.

Figure 16:
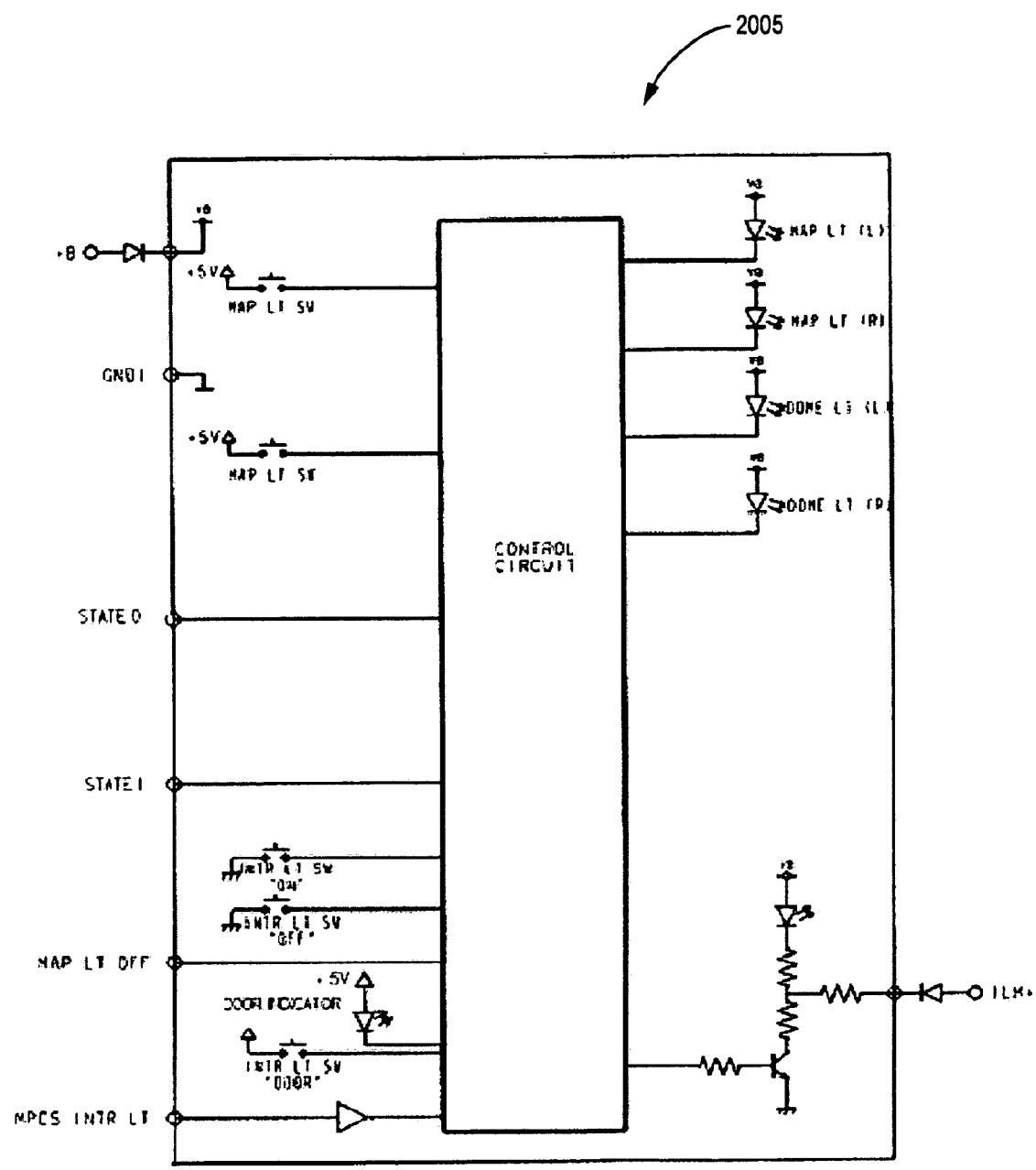

FIG. 16 shows a more detailed view of the map light and interior light control circuit 2005 shown in FIG. 15. The control circuit 2005 may contain any number of features such as those disclosed in U.S. Pat. Pub. No. 2006-0274540, the disclosure of which is hereby incorporated by reference in its entirety.

Figure 17:
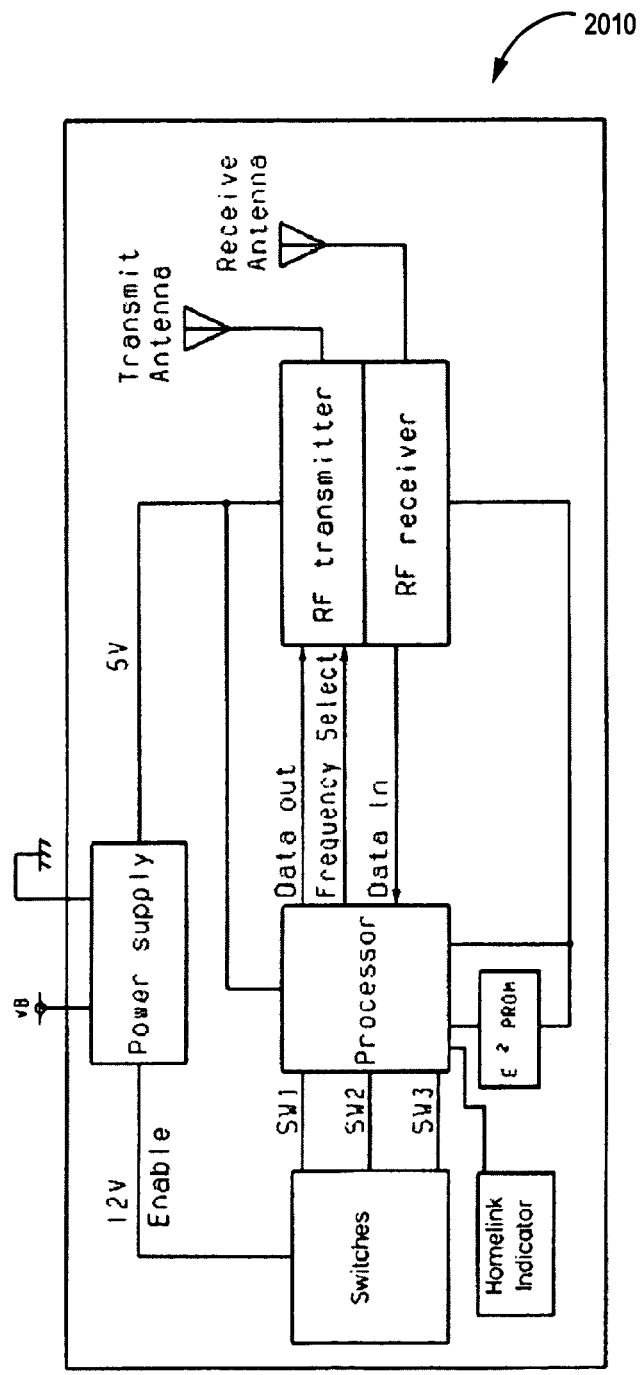

FIG. 17 shows a more detailed view of the wireless control system 2010 (e.g., Homelink® WCS) control circuit shown in FIG. 15. The circuit for the WCS 2010 may have any number of structures such as those disclosed in one or more of U.S. Pat. Nos. 5,442,340; 5,479,155; 5,583,485; 5,614,885; 5,614,885; 5,614,891; 5,646,701; 5,661,804; 5,699,054; 5,708,415; 5,854,593; 5,903,226; 6,137,421; 6,703,941; and/or 7,057,494. The disclosures of these U.S. patents are hereby incorporated by reference to the extent they are consistent with the reminder of the disclosure of this application. In addition to (or as an alternative to) the structures of the above listed patents, the WCS 2010 may have a structure such as that disclosed in one or more of U.S. Pat. Pub. Nos. 2006/0217850; 2006/0214813; 2006/0198523; 2006/0181428; 2006/0158344; 2005/0024229; 2004/0110472; 2003/0216139; and/or 2003/0197594. The disclosures of these U.S. patent publications are hereby incorporated by reference to the extent they are consistent with the reminder of the disclosure of this application.

While shown as separate circuits, the WCS circuit 2010 and the LED control circuit 2005 may be a common circuit as shown in PCT Patent Application No. PCT/US2007/076779, the disclosure of which is hereby incorporated by reference in its entirety.

Figure 18:
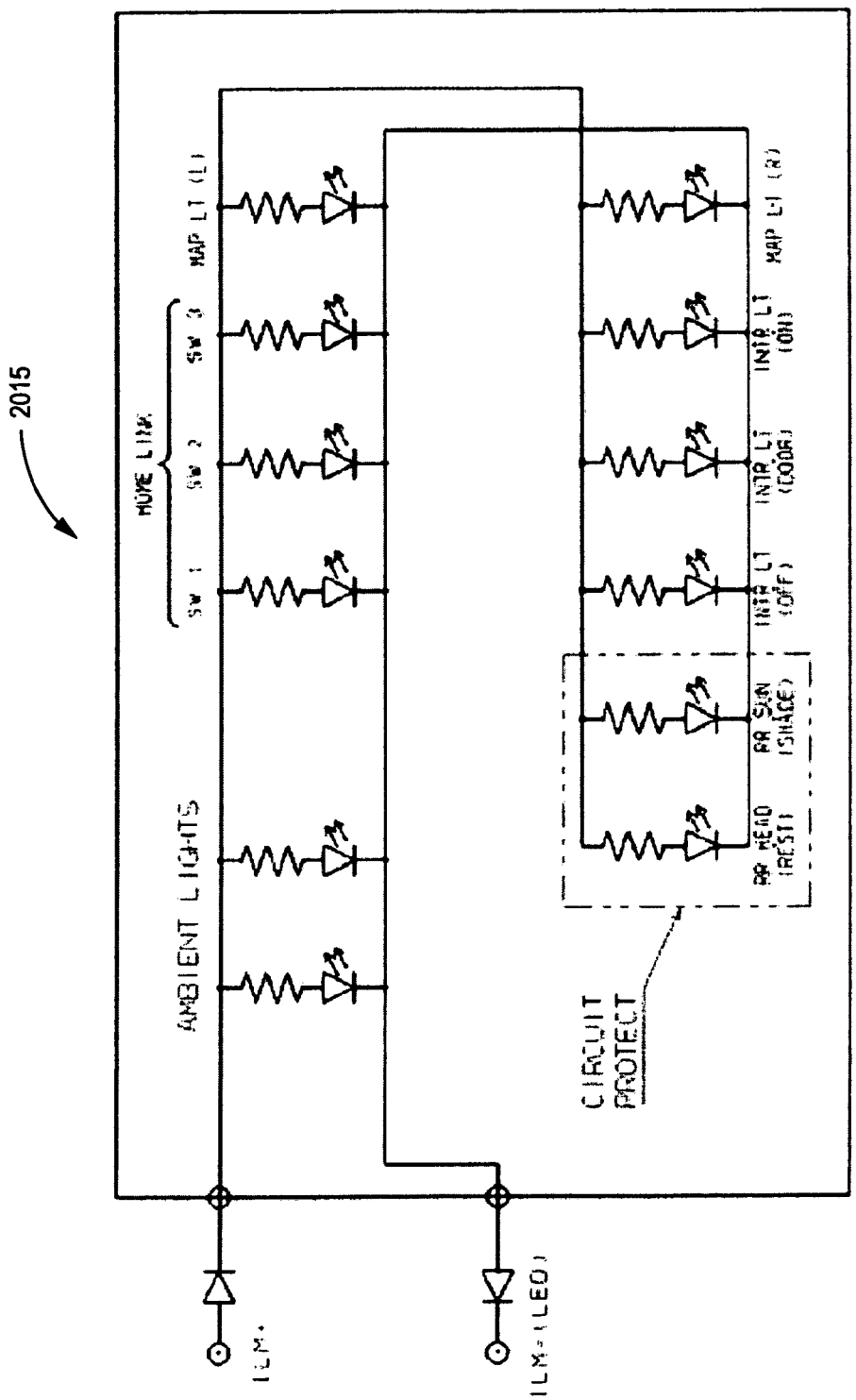

FIG. 18 is a detailed view of the switch illumination control circuit 2015 for controlling LEDs illuminating switching and other elements (buttons).

FIGS. 19-31 are exemplary embodiments of various electrical circuits that can be used with lighting devices that use LEDs. Any of the circuits described below can be used in the control circuitry described in FIGS. 15-18 above.

Figure 29:
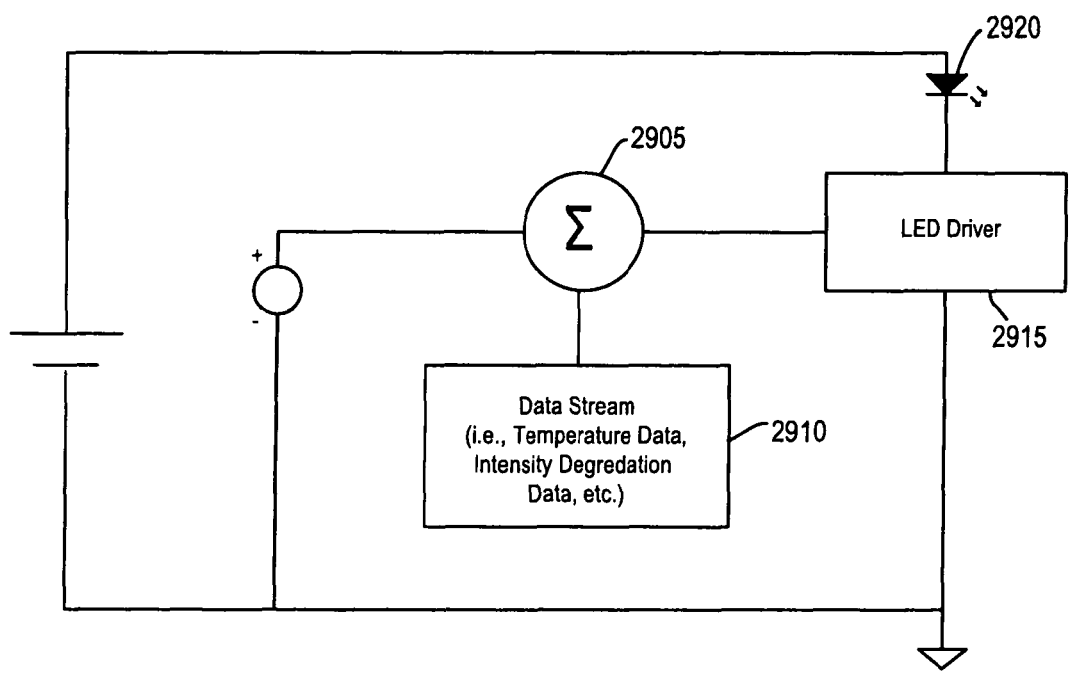
FIG. 29 shows an embodiment of a circuit for a lighting device that can be configured to drive an light emitting diode based on data.

According to one embodiment, FIG. 29 is an example of a control circuit using LED data to control an LED driver to drive an LED. A control circuit 2905 receives LED data 2910 as input. Based on the LED data 2010, the control circuit 2905 controls an LED driver 2915 that drives an LED 2920.

Figure 19A:
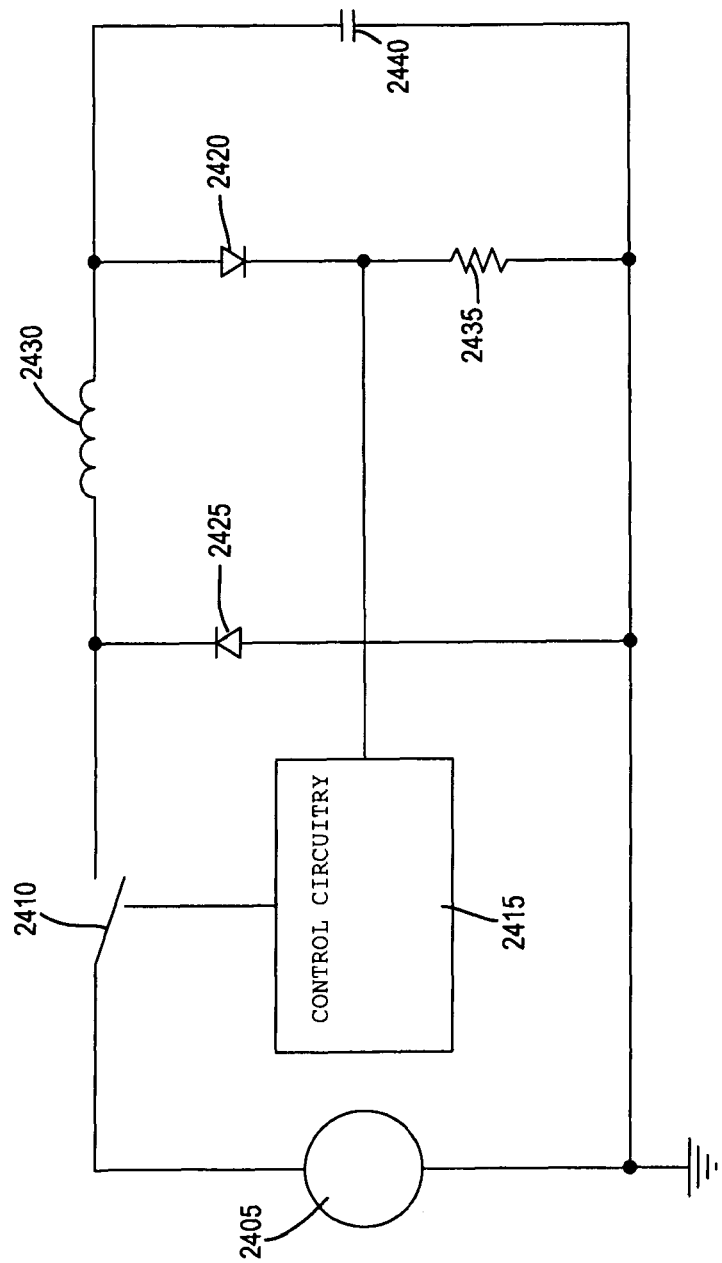
FIGS. 19A and 19B show an embodiment of a buck switch mode converter circuit for a lighting device.
Figure 19B:
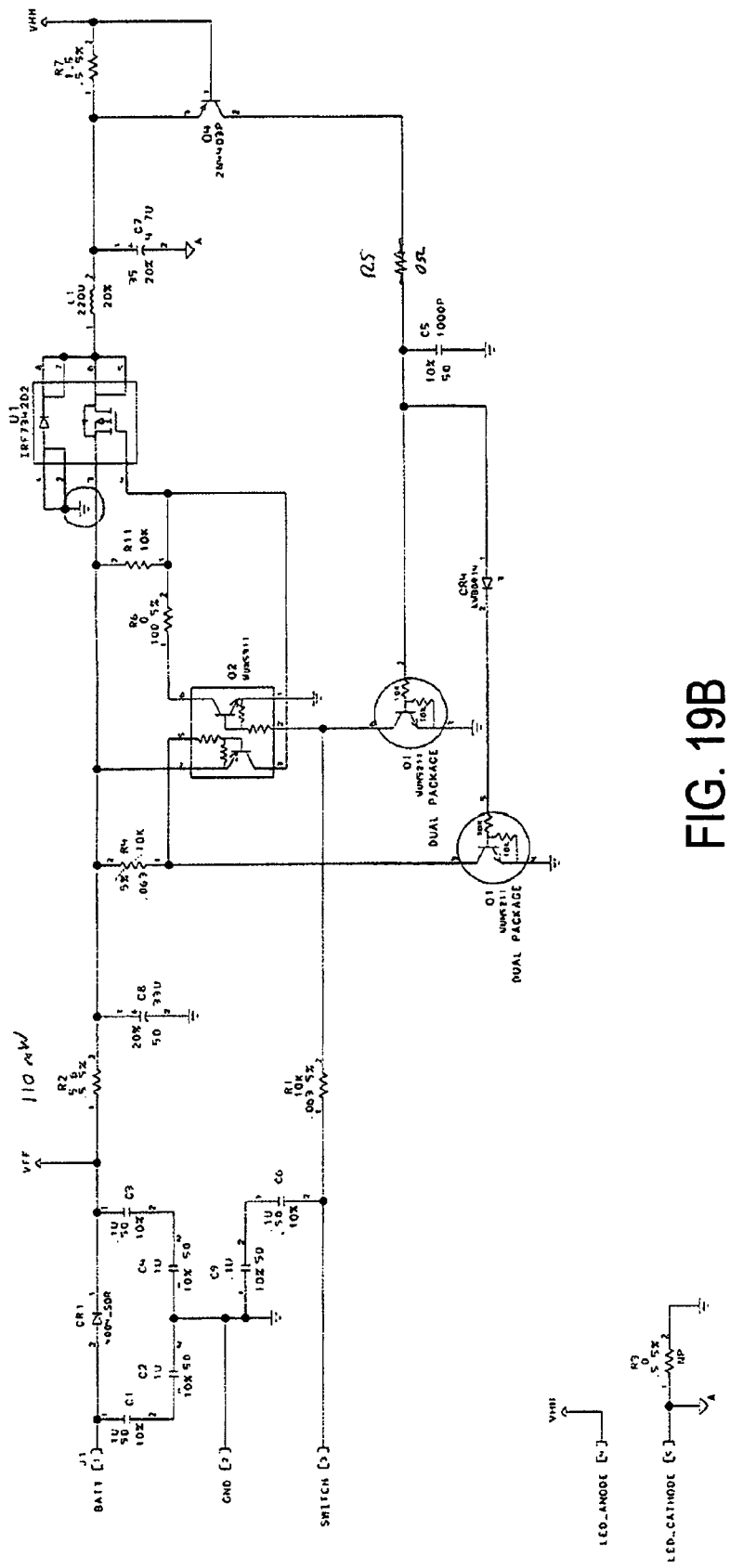

FIGS. 19A-19B are buck switch mode converters for driver thermal management, according to one embodiment. Constant current drivers for power LEDs as well as the LEDs themselves may have to dissipate large amounts of power if ran in a linear mode. Accordingly, the circuits shown in FIGS. 19A-19B use a switching supply as a power source for the LED drive circuitry to increase efficiency. In addition, the switching mode power supply reduces power used to power an LED. The support circuitry around the LED is no longer a heat source. The circuit shown in FIG. 19A includes a power source 2405, a switch 2410, control circuitry 2415, an LED 2420, a diode 2425, an inductor 2430, a resistor 2435 and a capacitor 2440. The circuits shown in FIGS. 19A-19B can be used to drive one or more LEDs. As shown, FIG. 19B is a more detailed implementation of FIG. 19A.

Figure 24:
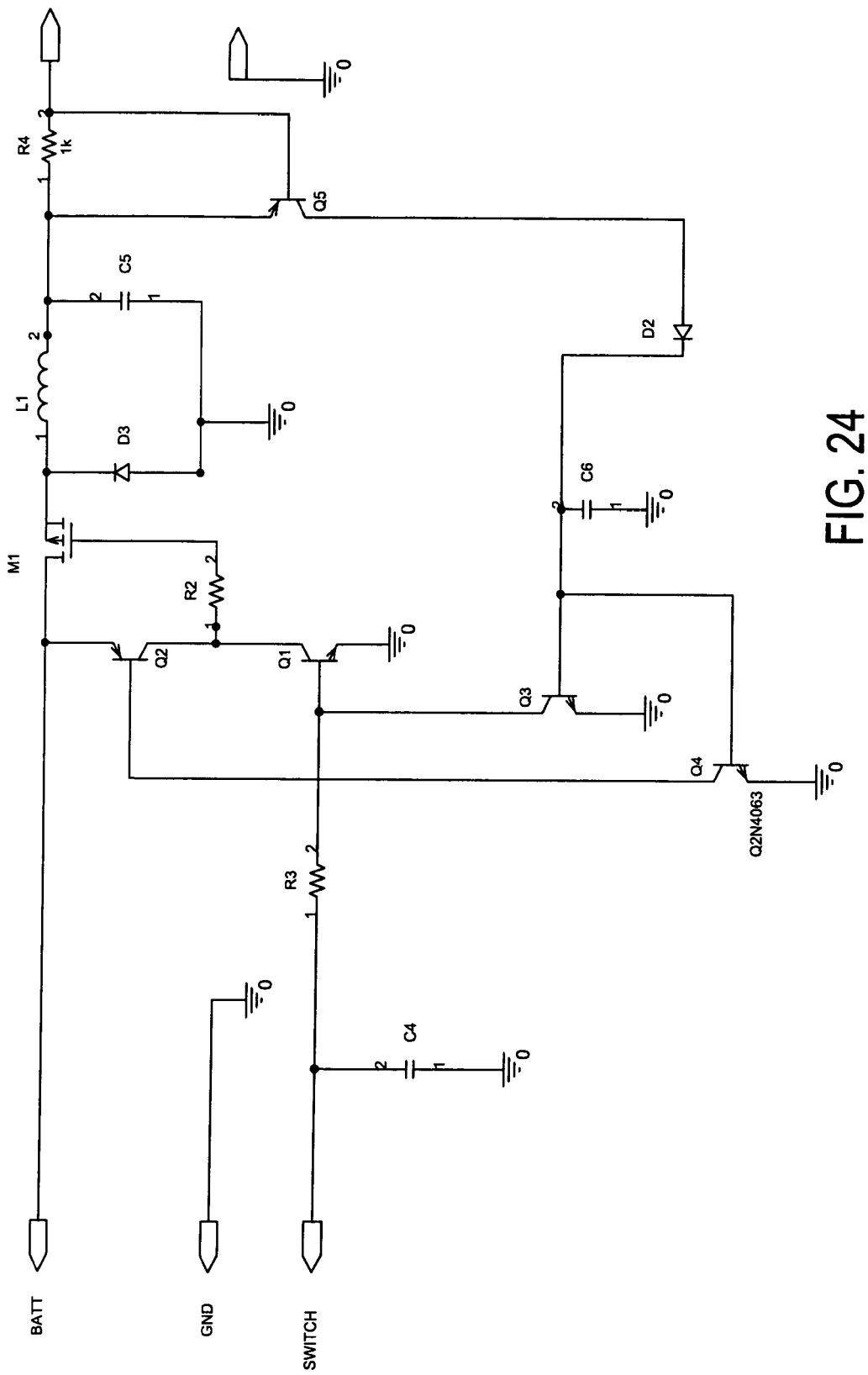
FIG. 24 shows an embodiment of a buck switch mode converter circuit for a lighting device.

FIG. 24 is a detailed version of the circuit shown in FIG. 19A and shows a circuit diagram that provides a constant current LED drive. The circuit solves the problem of driving a high power LED, for example the Luxeon® Star Power Light Source. The circuit induces minimal heat generation (i.e. power loss), while maintaining consistent luminous and color temperature output. The circuit provides a buck regulator with current feedback control. The combination of R7 and Q4 can maintain the current through the LED at a nominal 350 mA, regardless of the system voltage or the forward voltage drop of the LED, while providing controlling feedback for the regulator. Because the system voltage and LED forward voltage drop are widely varying, this design is ideal in that those parameters are inconsequential to its function. The luminous output and color temperature are directly related to the current through the LED, so this circuit design tightly controls this parameter. In addition, the circuit of FIG. 24 allows multiple serial LEDs to be driven without any circuit modifications and without any degradation of performance. The number of LEDs is limited by the system voltage, and the sum of the forward voltage drops of the LEDs. Since the current through each LED is identical, the output of the LEDs will be identical, within manufacturing tolerances.

Figure 20:
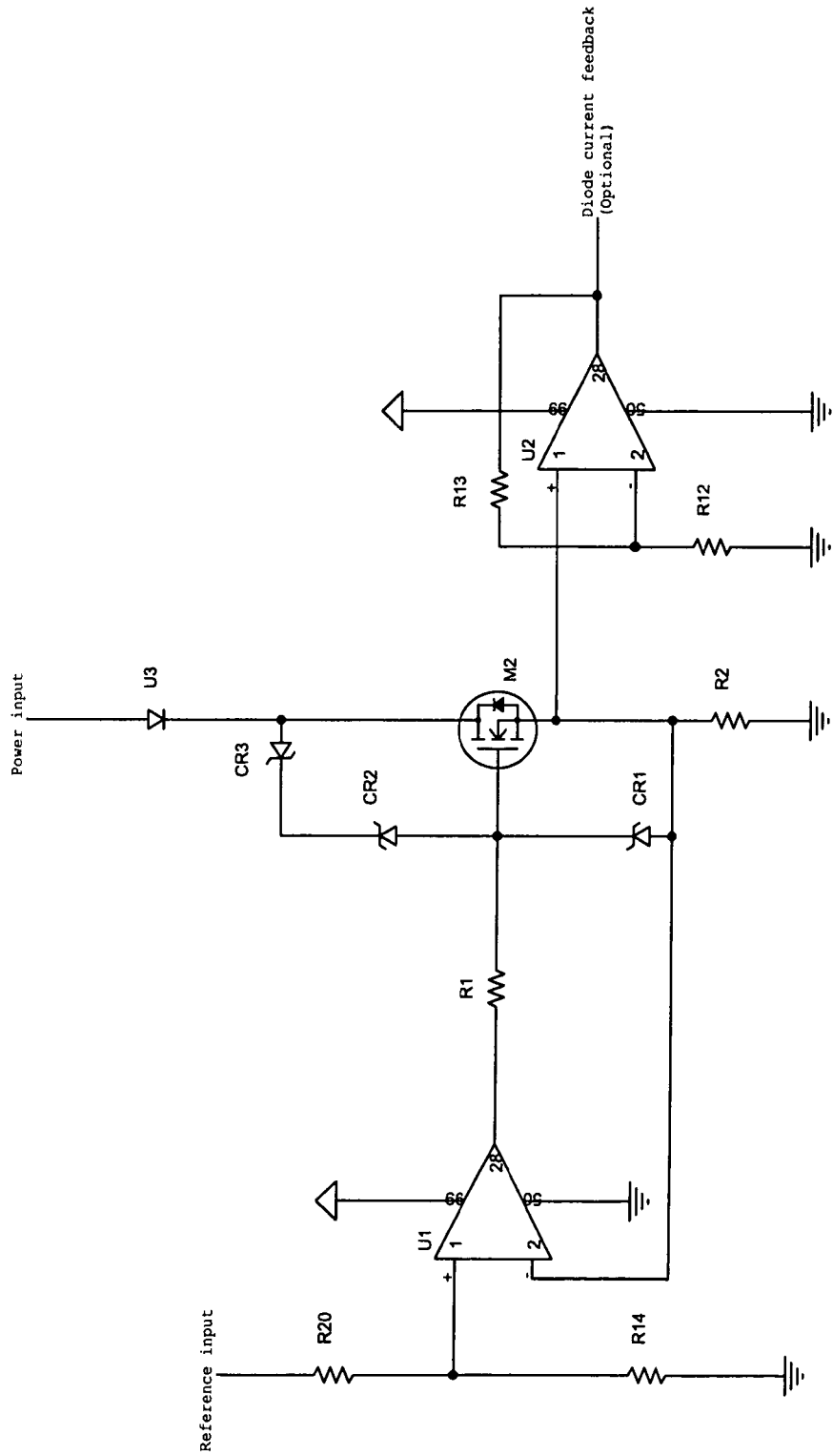
FIG. 20 shows an embodiment of a single driver circuit for a lighting device.
Figure 21:
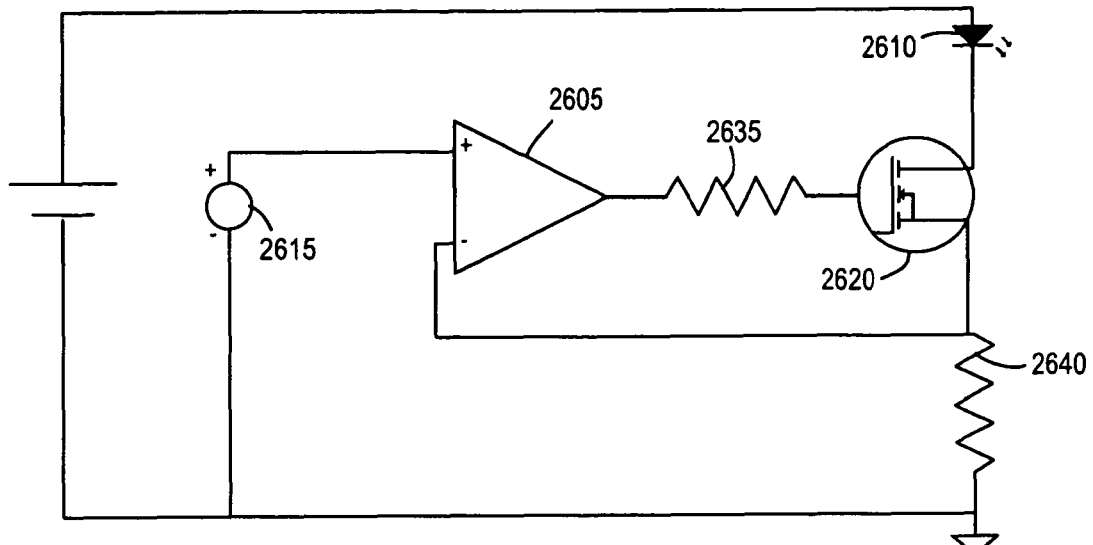
FIG. 21 shows an embodiment of is a driver circuit for a lighting device, which can be configured to address color and intensity variation.

FIGS. 20-21 are LED driver circuits for addressing color and intensity variation due to current variation. The LED driver circuits also reduce the affect of electromagnetic generation on nearby components. Forward voltage variation from LED to LED causes LED current variation resulting in color and intensity shifting. In addition, supply voltage variation causes LED current variation resulting in color and intensity shifting. FIG. 20 is a more detailed implementation of the circuit shown in FIG. 21. FIG. 20 is a circuit diagram that shows a circuit for a driver using a single drive circuit for multiple LEDs. The circuit provides for a linear, constant current supply and significantly reduces the affect of electromagnetic generation on the operation of the LED.

The circuit of FIG. 21 uses operational amplifier (OP-AMP) 2605 feedback to control the LED 2610 constant current drive. The OP-AMP 2605 forces currents through an LED 2610 and maintains a fixed current to obtain constant intensity of light. In more detail, a reference voltage Vref 2615 is applied to a positive terminal of an OP-AMP 2605. The negative terminal of the OP-AMP 2605 is connected to an output of the OP-AMP, in a negative feedback, non-inverting amplifier configuration. A resistor R1 2635 and a transistor 2620 (e.g., N-channel field effect transistor (N-channel FET)) are connected in series to an output terminal of the OP-AMP 2605, whereby the source of the transistor 2620 is feedback-connected to the negative terminal of the OP-AMP 2605, and whereby the drain of the transistor 2620 is connected to a cathode of a light-emitting diode (LED) 2610. The gate of the transistor 2620 and the source of the transistor 2620 are connected together. The anode of the LED 2610 is connected to a power source 2625. The source of the transistor 2620 (and thus the negative terminal of the OP-AMP 2605) is also connected to ground, via a resistor R2 2635. One of ordinary skill in the art will recognize the other types of transistors, such as a P-channel FET, a bipolar junction transistor (BJT), or a PNP or NPN transistor, may be utilized instead of the N-channel FET shown in FIG. 21.

In an alternative to the circuit of FIG. 21, the circuit can include a sensor to measure light output and adjust the current through the LED 2610 accordingly. LEDs inherently have a voltage across them, and that voltage varies from LED to LED. The sensor can compensate for the variation between individual LEDs.

Figure 22:
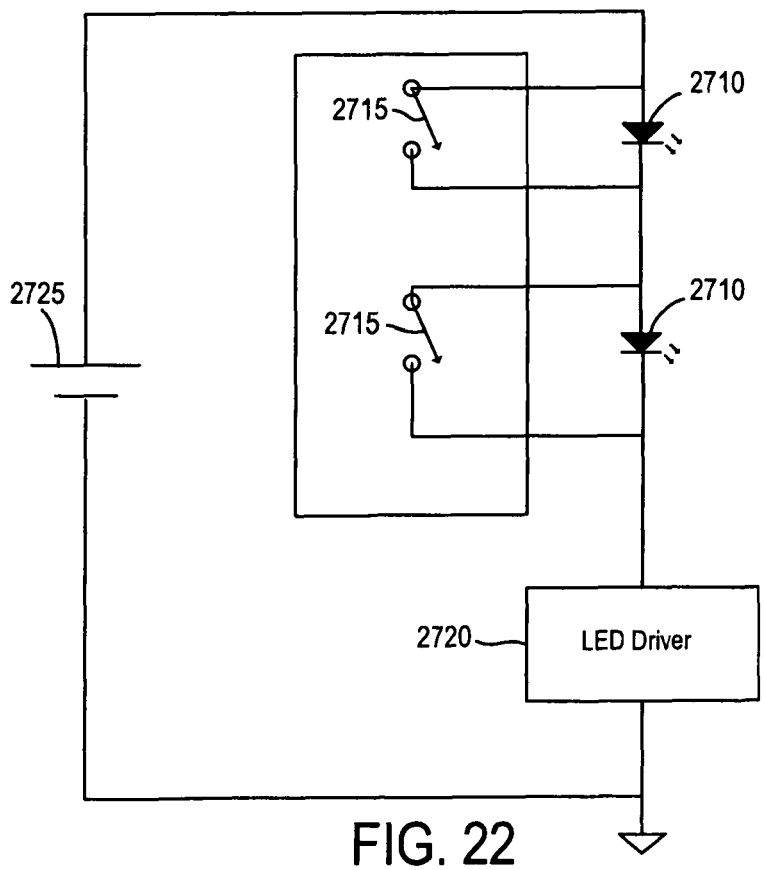
FIG. 22 shows an embodiment of a driver circuit for a lighting device, which can be configured to address cost and thermal management.

FIG. 22 is a constant current LED driver circuit for addressing cost and thermal management issues. The circuit of FIG. 22 uses a single drive circuit for two or more LEDs 2710. The circuit of FIG. 22 includes a first switch 2715 connected in parallel to a first LED 2710, at least a second switch 2715 connected in parallel to a second LED 2710, and an LED Driver 2720 for driving the LEDs 2710. The LEDs 2710 can be turned ON and OFF with the one or more switches 2715. Opening of the switches 2715 turns the respective LEDs 2710 ON, and closing of the switches 2715 turns the respective LEDs 2710 OFF. A power source 2625 provides a current supply to the anodes of the LEDs 2710. As an alternative to the switches 2715 shown in FIG. 22, transistors, relays or other types of electromechanical devices that have a TURN ON/TURN OFF mode of operation can be used to independently control the LEDs 2710 that are connected in series.

Figure 23:
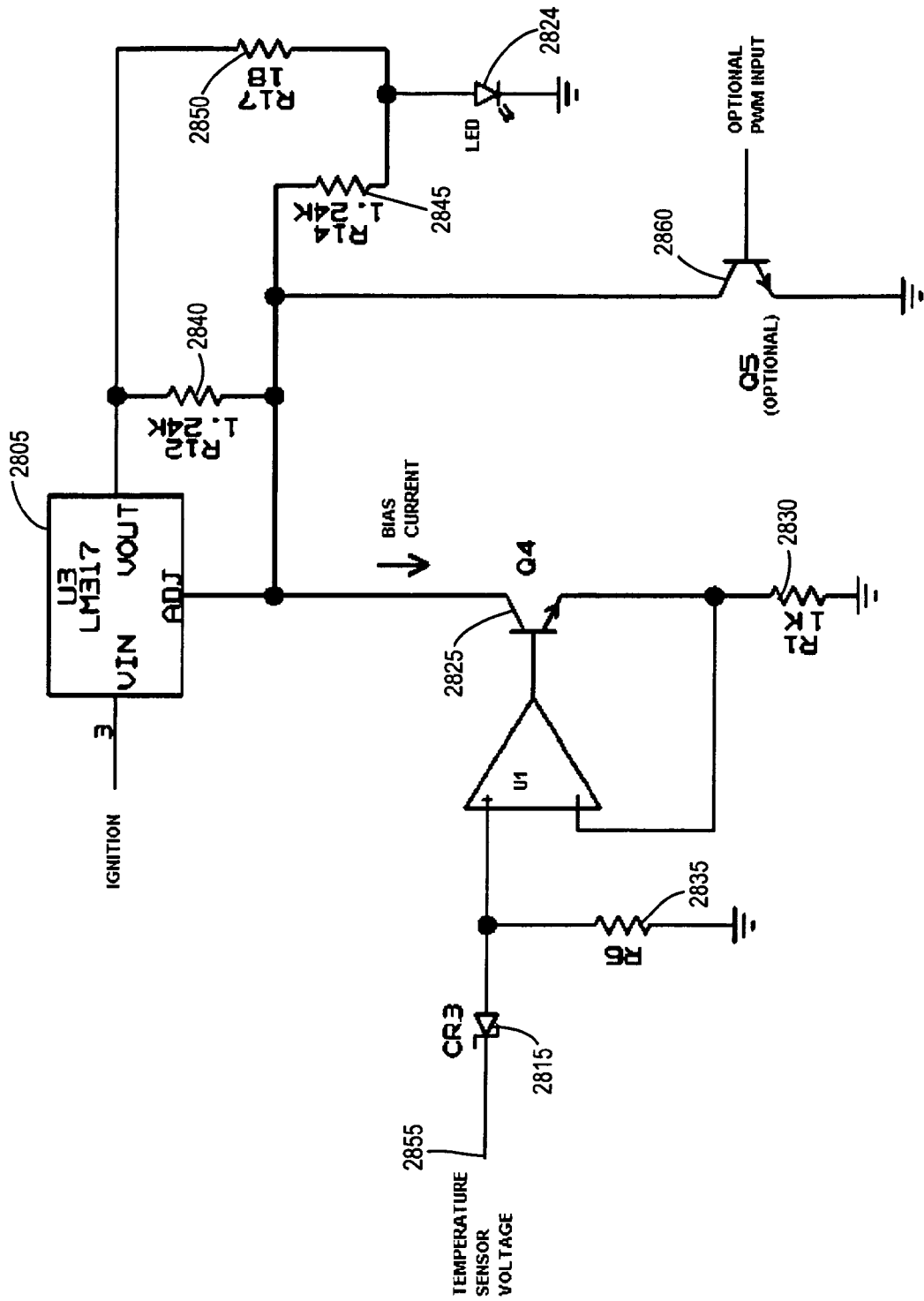
FIG. 23 shows an embodiment of a driver circuit for a lighting device that can be configured to adjust current based on temperature.

FIG. 23 is a linear constant current driver with temperature rollback capability. The circuit adjusts supply current based on a value such as temperature. The circuit includes a 3-terminal adjustable regulator U3 2805, an OP Amp U1 2810, a Zener Diode CR3 2815, an LED 2829, transistors Q4 2825 and Q5 2860 (transistor Q5 is optional), and resistors R1 2830, R6 2835, R12 2840, R14 2845 and R17 2850. A voltage value 2855 is input to the Zener Diode CR3 2815 to be provided to the positive input of the OP Amp U1 2810, whereby a Bias Current is provided to the drain of transistor Q4 2825. The voltage value can be generated by any component. According to one embodiment, the voltage value is generated by a temperature sensor. An ignition signal 2865 is provided to input Vin of the regulator U3 2805, and the output Vout of the regulator U3 2805 is provided to the anode of the LED 2820. An optional Pulse Width Modulated (PWM) input signal 2870 is provided to the optional transistor Q5 2860 in an alternative implementation of this circuit.

Figure 25:
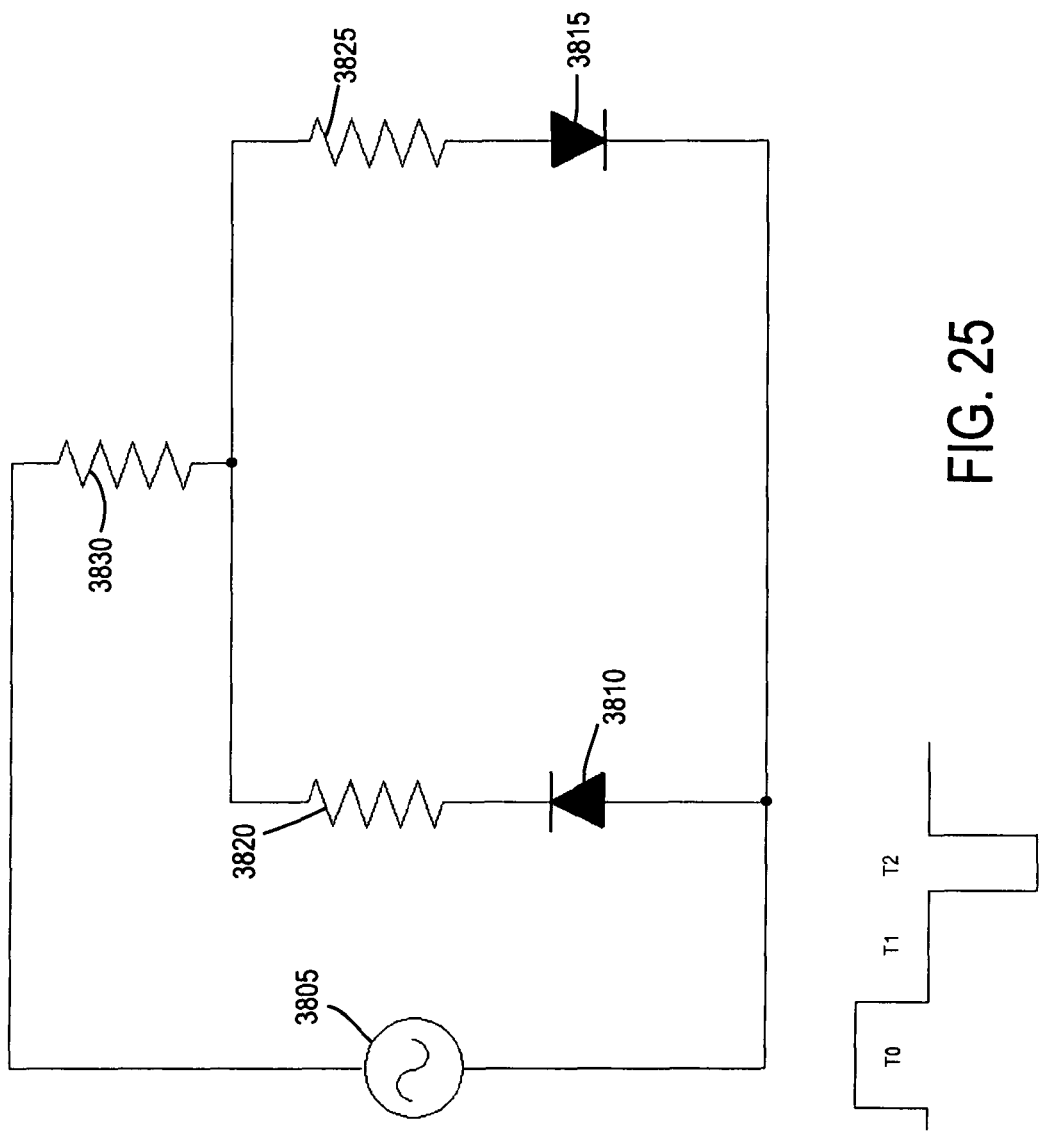
FIG. 25 shows an embodiment of a circuit for a lighting device that can be configured for color compensation.

FIG. 25 is a circuit for driving a bi-color LED package. Certain colors are unattainable via a single LED. The circuit of FIG. 25 achieves color variability with use of a bi-color LED package. The circuit of FIG. 25 drives an LED 3810 with an alternating current (AC) waveform 3805 to make use of a second LED 3815 die in a single package to compose or shift colors. Resistors R1 3820, R2 3825 and R3 3830 can also be connected to the AC waveform 3805. Depending on the two exact colors used, an infinite number of color combinations can be created, covering a large portion of the visible color spectrum. For example, when the current runs one way in an AC cycle, the LED package emits red light, and, when the current runs the other way in an AC cycle, the LED package emits white light. One of ordinary skill in the art will appreciate that this circuit can be used to create different color compositions by different color LEDs.

Figure 26:
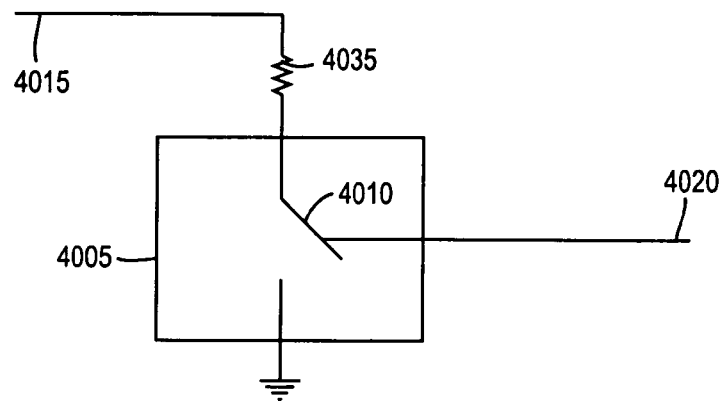
FIGS. 26 and 27 show embodiments of circuits for driving a light emitting diode.
Figure 27:
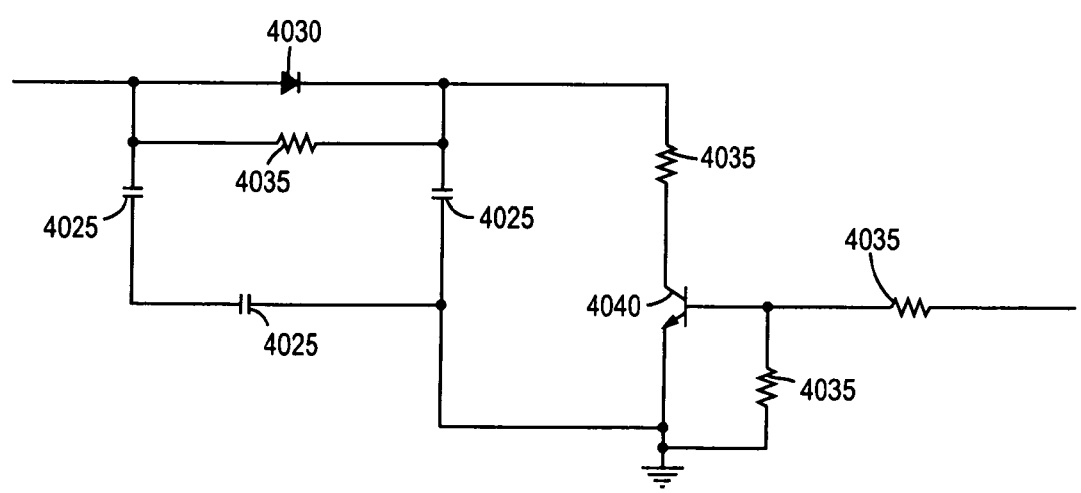
Figure 28:
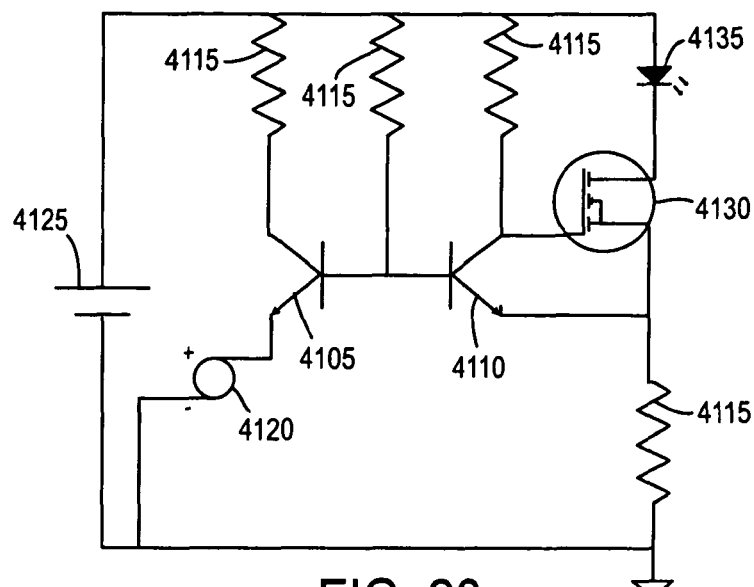
FIG. 28 shows an embodiment of a circuit for a lighting device that can be configured to address color variation and temperature and variability of current source.

FIGS. 26-27 show circuits for drawing additional current to defeat a load shed. LEDs do not draw enough current when vehicle load shed is active to turn ON. The circuit in FIG. 26 includes an electronic control module 4005, having a switch 4010 and a continuity signal 4015 and a wake-up signal 4020 as inputs to the electronic control module 4005. The circuit of FIG. 27 includes first, second, and third capacitors 4025, a reverse protection diode 4030, and a first resistor 4035 provided in parallel to the reverse protection diode 4030. The circuit of FIG. 30B also includes second, third, and fourth resistors 4035 connected to different parts (base, emitter, collector) of a bi-polar transistor 4040. A wake-up signal 4020 is provided to the base of the transistor 4040 via the fourth resistor R4 4035, and an Inadv power signal 4015 is ultimately provided control circuitry for an LED (not shown in this drawing).

Figure 31:
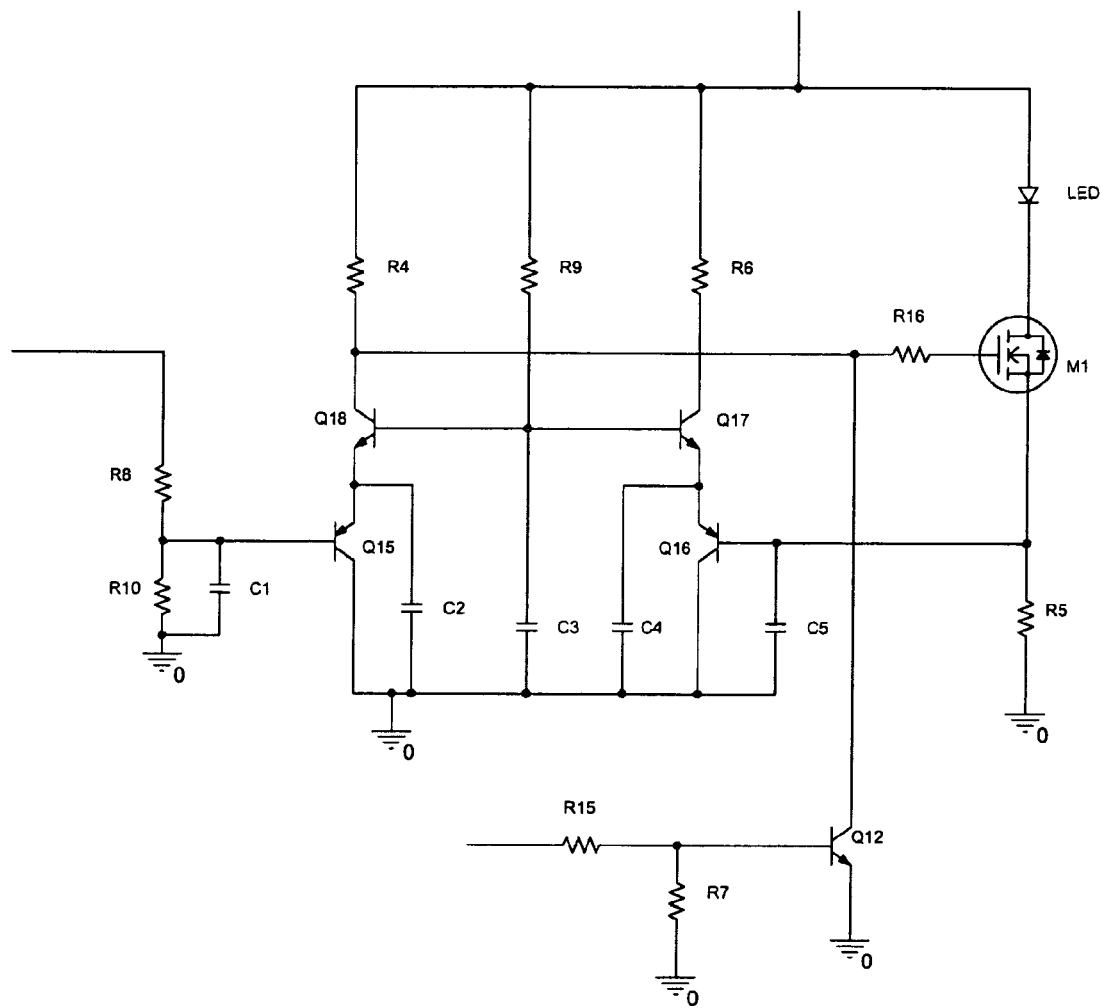
FIG. 31 shows an embodiment of a circuit for a lighting device that can be configured to drive a light emitting diode.

FIG. 31 is a circuit diagram that shows a circuit for addressing color variation and temperature and variability of current source. Forward voltage variation from LED to LED causes LED current variation resulting in color and intensity shifting. In addition, supply voltage variation causes LED current variation resulting in color and intensity shifting. The circuit of FIG. 31 uses discrete transistors 4105, 4110 to control the LED constant current drive. The circuit of FIG. 41 includes two back-to-back bipolar junction transistors 4105, 4110, first through fourth resistors 4115, reference voltage source Vref 4120, power source 4125, NMOS transistor 4130, and an LED 4135.

Figure 30:
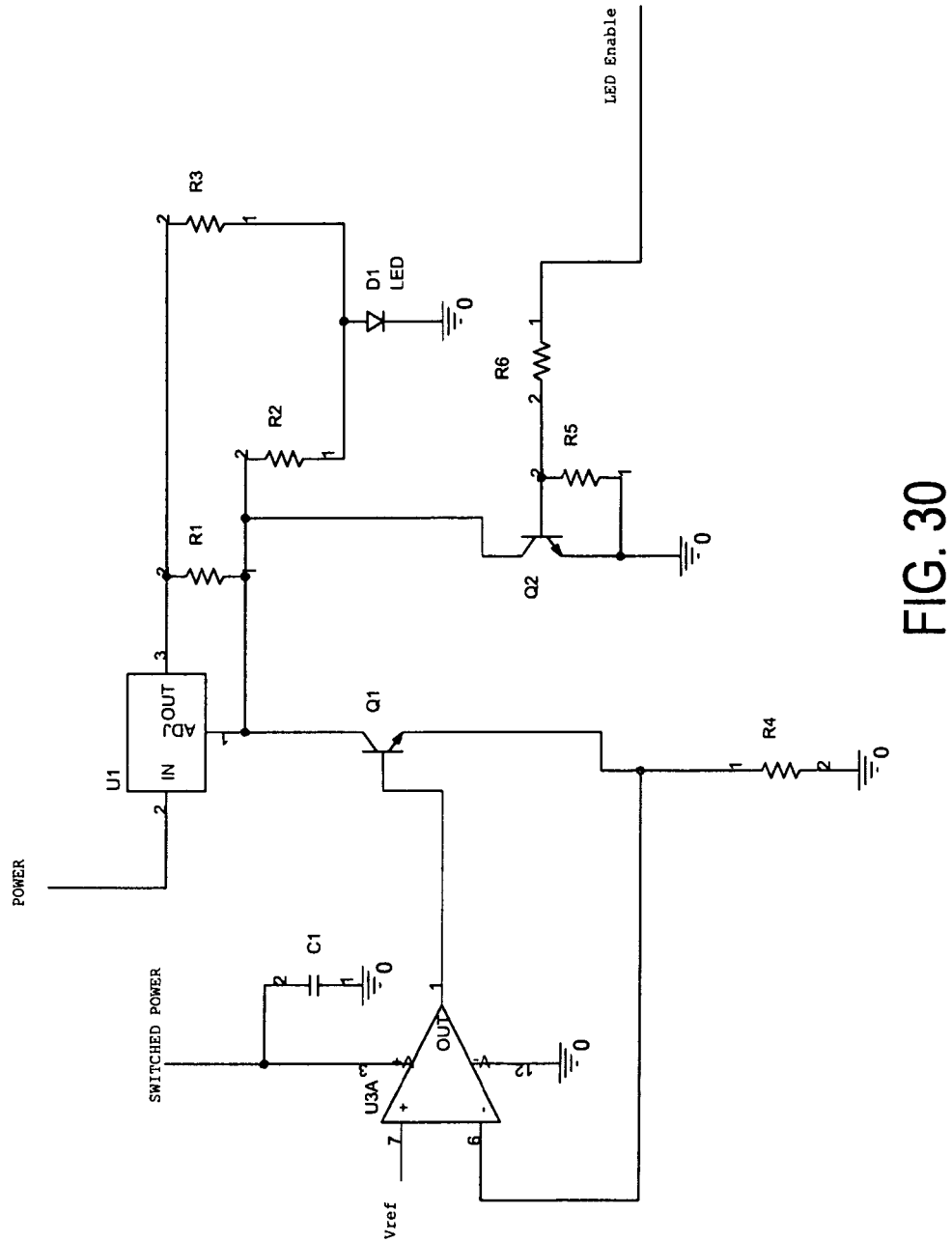
FIG. 30 shows an embodiment of a circuit for a lighting device that can be configured for control of a light emitting diode.

FIG. 30 is linear constant current driver for driving an LED based upon a reference voltage, according to an exemplary embodiment. The circuit of FIG. 30 uses discrete logic to turn transistor Q4 ON and OFF. The circuit of FIG. 30 is similar to the circuit shown in FIG. 23, and includes OP AMP U2, regulator U3, transistor Q4, LED, and transistor Q5. The circuit further includes capacitor C8 and resistors R11, R12, R14, and R17. A power signal POWER is provided to input port Vin of regulator U3, a reference voltage signal Vref is provided to the positive terminal of Op AMP U2, and an LED Enable signal is provided to the gate of transistor Q5.

FIG. 31 is an exemplary embodiment of an electrical feature that can be used with lighting devices that use LEDs, for example, lighting devices for use in the interior of a vehicle. Forward voltage variation from LED to LED and supply voltage variation cause LED current variation resulting in color and intensity shifting. FIG. 31 shows a circuit for an LED light source that uses a negative feedback amplifier to provide a constant current level to control (and maintain) the light emitted by the LED. R24 and R32 generate a fixed reference voltage at TP62 which is mirrored by the negative feedback amplifier at TP72. The circuit discretely implements an OP-AMP composed of Q4, Q6A, Q6B, and Q9 as well as R35, R46, and R58. R16 serves as a sampling resistor to measure the current through MOSFET Q7 and thus through the LED (CR11). Q9 is an emitter follower which buffers the voltage at TP72 with an offset of approximately 0.7 volts (due to the inherent 0.7 volt VBE of Q9) which can be observed at TP64. Similarly, Q4 buffers the voltage at TP62 with a similar 0.7 volt VBE drop which can be observed at TP68. Because Q4 and Q9 carry approximately the same current, these VBE drops tend to be compensatory over the operational temperature range. Transistor pair Q6A and Q6B serve to amplify the voltage difference between the emitter of Q6A and Q6B (TP64 and TP68 respectively). Again, the VBE voltage drops of Q6A and Q6B will tend to compensate each other over the operational temperature range. This amplified voltage difference results in a difference in the collector currents of Q6A and Q6B and a voltage across R35. This voltage across R35 serves to either increase or decrease the gate to source bias voltage as appropriate to either increase or decrease the source current of Q7 and thus modify the illumination current of CR11 as appropriate. This discrete implementation allows the designer access to the internal nodes of the negative feedback amplifier so that it can be rendered less susceptible to RF interference by the utilization of relatively large values for bypass capacitors C18, C32, C34, C36, and C39. This circuit as described is functionally similar to that of FIG. 26 with the exception of the discrete implementation of the design. Q17 serves to allow the design to use a disabling input such as a pulse width modulator (PWM) to vary the apparent brightness of the LED while maintaining a nominally constant current and thus a consistent coloring of the LED illumination. One of ordinary skill in the art will recognize that these features could be implemented using other types of transistors, such as, for example, a P-channel FET, or a bipolar junction transistor (BJT) of either PNP or NPN polarity.

According to an exemplary embodiment, a circuit for thermal management can be used to drive an LED. The circuit could include, for example, an LED, a Positive Temperature Coefficient (PTC) thermistor, an LED Control and Driver Unit, and a power source. Constant current drivers for powering LEDs as well as the LEDs themselves may have to dissipate large amounts of power. As a result, the LEDs may not be able to run at full power indefinitely. The circuit uses a PTC as a variable resistor to reduce the current used to power an LED and the temperature generated when powering an LED. The circuit includes a power source such as a battery, an LED, a PTC, and an LED control and driver.

According to an exemplary embodiment, a circuit for voltage management drives an LED. Forward voltage variation from LED to LED causes LED current variation resulting in color and intensity shifting. In addition, supply voltage variation causes LED current variation resulting in color and intensity shifting. The voltage management circuit uses a constant current load/source (e.g., Field Effect Transistor (e.g., JFET)). The circuit for voltage management includes a power source such as a battery, an LED, a JFET, and, optionally, a resistor. This circuit provides a constant current level to control (and maintain) the light emitted by the LED.

According to an exemplary embodiment a circuit for driving an LED is a circuit for thermal management and voltage management. Forward voltage variation from LED to LED causes LED current variation resulting in color and intensity shifting. In addition, supply voltage variation causes LED current variation resulting in color and intensity shifting. Further, constant current drivers for power LEDs may have to dissipate large amounts of power and, as a result, they may be damaged. The thermal management and voltage management circuit uses a linear regulator as a constant current source. The linear regulator shuts down when it overheats so that the circuit shuts down before the LED overheats and becomes damaged. The current source thus can be thermally protected. The thermal management and voltage management circuit includes a power source such as a battery, a linear regulator, a resistor, and an LED. The linear regulator can be an LM317 adjustable regulator or equivalent.

According to an exemplary embodiment, a circuit for allowing LED lighting to gradually turn ON or OFF (e.g. dimming), rather than instantly turn ON or OFF is provided. The circuit recognizes that it is not always desirable for an LED to turn instantly ON or OFF. The circuit includes a power source, an LED connected to the power source, an LED driver connected to the LED and a ramped pulse width modulation controller connected to the LED driver. The circuit uses a timer (e.g., an LM555 timer chip) to create a pulse width modulation signal for a soft start or soft stop of power to the LED. The circuit includes an LED logic control system to start ramping, which is input to the timer. The circuit further includes a voltage source that has a positive end and a negative end respectively connected to leads of the timer. The circuit further includes a capacitor and a resistor connected in series, coupled between the negative side of the voltage source and an anode of an LED. The circuit also includes an LED driver that is provided between a cathode of the LED and a lead of the timer. A ramp rate controller is connected to the timer. At turn on the ramped pulse width modulation controller generates a very low duty-cycle PWM which slowly ramps toward 100% duty cycle. At turn off, the process reverses so that the duty cycle slowly ramps back towards 0%. Thus, the signal modulates the intensity of the LED in a digital fashion.

According to an exemplary embodiment, a circuit for addressing over-voltage and heat is provided. The circuit provides a solution to the following problems. Drivers for power LEDs as wells as the LEDs themselves may have to dissipate large amounts of power. As a result, they may not be able to run at full power indefinitely. In addition, it is sometimes desirable to dim down an LED.

The circuit for addressing over-voltage and heat uses discrete components to rollback current by switching in another resistor. The circuit includes first and second relays provided in parallel to first and second resistors of a resistor array. The first and second relays can be implemented as transistors, relays, or other electromechanical devices in alternative implementations. The resistor network can be switched ON and OFF; the resistors control the intensity of the LEDs. While the resistor array shown in the circuit diagram in FIG. 39 includes two resistors, it should be understood that, according to other exemplary embodiments, the resistor array may include three or more resistors.

According to an exemplary embodiment, a circuit that provides a solution to undesirable degradation of LED output as a result of time and/or temperature is provided. The circuit uses intensity feedback to compensate for changes in LED output or illumination, either via analog circuitry or via a microcontroller. There could also be a degradation curve or similar information programmed into the microcontroller. The circuit includes a control circuit, a light sensor, and LED driver circuitry. Alternatives to the circuit can include information sources of intensity degradation other than a light sensor.

According to an exemplary embodiment, a circuit for addressing thermal compensation and/or LED degradation over time is provided. LED output can vary with temperature. The circuit for addressing thermal compensation and/or LED degradation over time varies the reference voltage of the drive circuitry based on temperature/time feedback. The circuit includes a reference voltage source Vref, an LED driver, an LED, and a power source. A data stream is provided to one port of a Summation Circuit, whereby Vref is provided to another port of the Summation Circuit. The data stream includes temperature data and intensity degradation data of the LED. The output of the Summation Circuit provides a compensation signal for the LED Driver, which drives the LED. In more detail, the color and intensity of the LED changes the temperature of the LED. Accordingly, the circuit compensates for these temperature changes.

According to another embodiment, a heat sink for an LED circuit could provided. The heat sink is used for thermal management of a printed circuit board. Constant current drivers for power LEDs as well as the LEDs themselves may have to dissipate large amounts of power. As a result, they may not work correctly without a heat sink. According to one embodiment, an insert molded metallic screw BOS can be used as the heat sink for the printed circuit board. The heat sink is used for thermal management of a printed circuit board. Constant current drivers for power LEDs as well as the LEDs themselves may have to dissipate large amounts of power. As a result, they may not work correctly without a heat sink. According to another embodiment, a TO-220 package is placed on a printed circuit board with a heat sink, and these components are then riveted together with a single rivet.

Figure 32A:
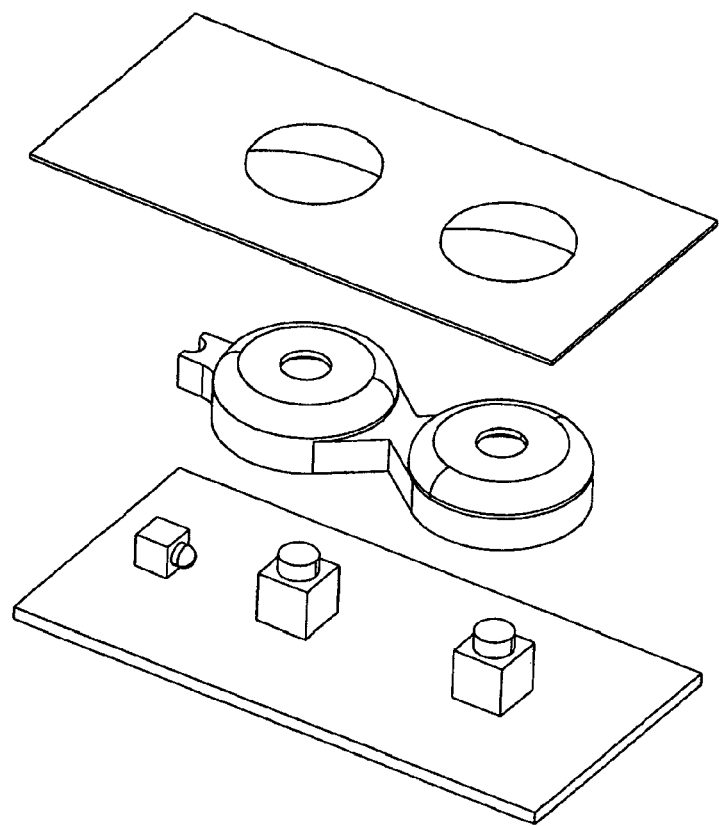
FIGS. 32A and 32B show an exploded view and a cross-sectional view of an embodiment of a lighting device having a backlight button assembly.
Figure 32B:
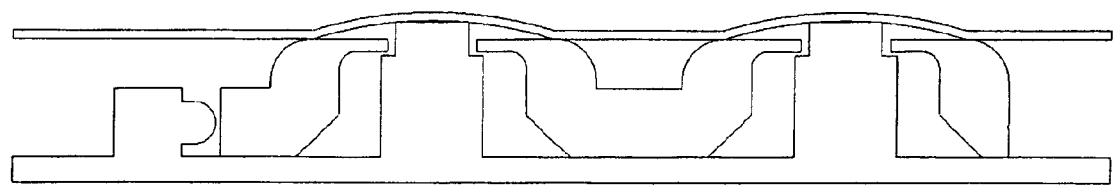

FIG. 32A is an exploded view of a backlit button assembly. FIG. 32B is a cross section of the backlit button assembly. The button assembly of FIGS. 32A-32B provides a solution to the following problem. A console or other component may include two or more buttons with backlighting. The button assembly of FIGS. 32A-32B provides a means to illuminate multiple buttons with a single LED. The button assembly includes one or more switches coupled to a circuit board. The circuit board further includes an LED to provide a backlight for the buttons. A light guide substantially surrounds the switches and has an end that is proximate to the LED. A front panel, shown in FIGS. 32A and 32B as a thin film, is coupled to the light guide opposite of the circuit board. The panel includes partially transparent areas that allow the light directed from the LED by the light guide to shine through the panel. According to other exemplary embodiments, multiple LEDs may be provided to light multiple buttons or groups of buttons.

Figure 33:
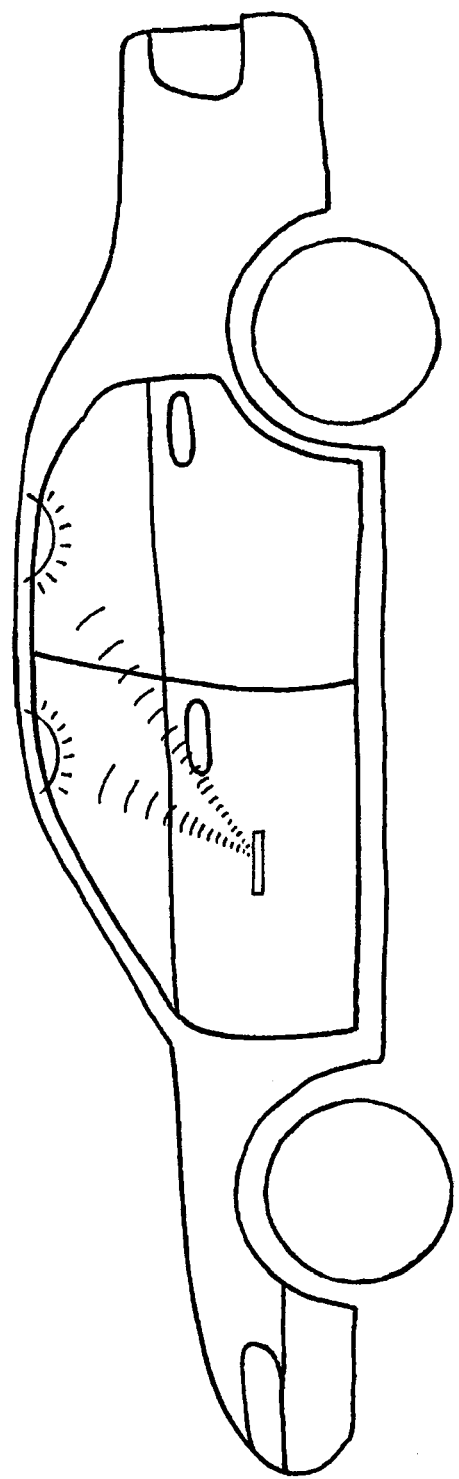
FIG. 33 is a side view of an embodiment of a vehicle having a remote switch for an overhead lamp.

FIG. 33 is a side view of a vehicle with a remote switch for an overhead lamp, such as an overhead rear lamp or an overhead console. The remote switch for an overhead lamp provides a solution to the following problem. Lamps may have switches that are hard to reach for a user. The lamp may be controlled by a switch located in an easy to reach area such as a center floor console or a door panel. In the embodiment of FIG. 35, an input device in the form of a switch can be provided in the door handle of a driver's side door. Actuating the door handle can trigger the input device to send a signal to the overhead lamp(s) so that the overhead lamp(s) turn ON/OFF. According to another exemplary embodiment, the lamp may be controlled with switchless input devices. Switchless input devices provide a solution to switches that are hard to actuate or reach for users such as small children or the elderly. The switchless input device generates a signal that is sent to the overhead lamp(s) to turn the overhead lamp(s) ON/OFF. According to various exemplary embodiments, the switchless input devices may include touch sensors or motion sensors, and the devices may generate infrared signals, radio signals, etc. Remote switches and switchless input devices also provide surprise and delight to customers/users.

It is important to note that the construction and arrangement of the lighting devices as shown in the various exemplary embodiments is illustrative only. Although only a few embodiments of the present systems have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described in the application. For example, elements shown as integrally formed may be constructed of multiple parts or elements, the position of elements may be reversed or otherwise varied, and the nature of number of discrete elements or positions may be altered or varied. Accordingly, all such modifications are intended to be included within the scope of the subject matter described in the application. The order or sequence of any process or method steps may be varied or re-sequenced according to alternative embodiments. Other substitutions, modifications, changes and omissions may be made in the design, operating conditions and arrangement of the exemplary embodiments.

What is claimed:

1. A lighting device for a vehicle, comprising:
    control circuitry connected to a first substrate; and
    a light emitting diode connected to a second substrate,
    wherein the control circuitry is configured to drive the light emitting diode,
    wherein the first substrate has a generally U-shape with a central opening, and the second substrate is provided within the central opening.

2. The lighting device, as claimed in claim 1, wherein the first substrate includes a printed circuit board.

3. The lighting device, as claimed in claim 1, further comprising a mechanism configured to permit movement of the second substrate relative to the first substrate.

4. The lighting device, as claimed in claim 1, further comprising a flexible conductive interconnect that electrically connects the control circuitry to the light emitting diode.

5. The lighting device, as claimed in claim 1, further comprising a light emitting diode connected to the first substrate.

6. The lighting device, as claimed in claim 1, wherein a plurality of light emitting diodes are connected to the second substrate.

7. The lighting device, as claimed in claim 1, further comprising a housing for mounting the first substrate on an interior portion of the vehicle.

8. A lighting device for a vehicle, comprising:
    control circuitry connected to a first portion of a first substrate;
    a light emitting diode connected to one of a second portion of the first substrate and a second substrate; and
    a flexible conductive interconnect that electrically connects the control circuitry to the light emitting diode, the flexible conductive interconnect having a first end coupled to the first substrate and a second end coupled to one of the second portion of the first substrate and the second substrate,
    wherein at least one of the first and second ends has a longitudinal axis that is configured generally perpendicular to a longitudinal axis of the coupled substrate through an opening in the substrate,
    wherein the one of the second portion of the first substrate and the second substrate is configured to be moveable relative to the first portion of the first substrate, and
    wherein the control circuitry is configured to drive the light emitting diode.

9. The lighting device, as claimed in claim 8, wherein the first portion of the first substrate includes a printed circuit board.

10. The lighting device, as claimed in claim 8, wherein the flexible conductive interconnect includes a third portion of the first substrate.

11. The lighting device, as claimed in claim 8, wherein the flexible conductive interconnect is a component separate from the first substrate and the second substrate.

12. The lighting device, as claimed in claim 8, further comprising a light emitting diode connected to the first portion of the first substrate.

13. The lighting device, as claimed in claim 8, wherein a plurality of light emitting diodes are connected to the at least one of the second portion of the first substrate and the second substrate.

14. The lighting device, as claimed in claim 8, wherein the at least one of the first and second ends includes an element that enters the opening at a first surface of the substrate and exits the opening at a second surface of the substrate, and wherein the element is coupled to the second surface.

15. A lighting device for a vehicle, comprising:
    a light emitting diode;
    control circuitry configured to drive the light emitting diode and connected to a first substrate;
    a flexible conductive interconnect that electrically connects the control circuitry to the light emitting diode; and a mechanical connector configured to provide an electrical connection between the flexible conductive interconnect and the light emitting diode, the mechanical connector being configured to extend through an opening in a second substrate supporting the light emitting diode.

16. The lighting device, as claimed in claim 15, wherein the first substrate includes a printed circuit board.

17. The lighting device, as claimed in claim 15, wherein the flexible conductive interconnect is connected to the first substrate.

18. The lighting device, as claimed in claim 15, wherein the mechanical connector engages the second substrate through a one-quarter turn connection.

19. The lighting device, as claimed in claim 15, further comprising a light emitting diode connected to the first substrate.

20. The lighting device, as claimed in claim 15, further comprising a housing for mounting the first substrate on an interior portion of the vehicle.

* * * * *